United States Patent
Ricks et al.

(10) Patent No.: US 7,252,893 B2
(45) Date of Patent: *Aug. 7, 2007

(54) ANTHRACENE DERIVATIVE HOST HAVING RANGES OF DOPANTS

(75) Inventors: Michele L. Ricks, Rochester, NY (US); Tukaram K. Hatwar, Penfield, NY (US); Jeffrey P. Spindler, Rochester, NY (US); Lelia Cosimbescu, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 362 days.

This patent is subject to a terminal disclaimer.

(21) Appl. No.: 10/780,436

(22) Filed: Feb. 17, 2004

(65) Prior Publication Data

US 2005/0181232 A1   Aug. 18, 2005

(51) Int. Cl.
*H01L 51/50* (2006.01)
(52) U.S. Cl. .................. 428/690; 428/917; 313/504; 313/506; 313/112; 257/98
(58) Field of Classification Search ............ 428/690, 428/212, 917; 257/89, 98; 313/112, 504, 313/506
See application file for complete search history.

(56) References Cited

U.S. PATENT DOCUMENTS

| | | | |
|---|---|---|---|
| 4,769,292 A | | 9/1988 | Tang et al. |
| 4,885,211 A | | 12/1989 | Tang et al. |
| 5,121,029 A | * | 6/1992 | Hosokawa et al. ......... 313/504 |
| 5,405,709 A | | 4/1995 | Littman et al. |

(Continued)

FOREIGN PATENT DOCUMENTS

| | | |
|---|---|---|
| EP | 0 429 821 | 12/1998 |
| EP | 1 009 044 | 6/2000 |
| EP | 1187235 A2 * | 3/2002 |
| EP | 1 339 264 | 8/2003 |
| EP | 1 340 798 | 9/2003 |
| EP | 1 375 624 | 1/2004 |
| EP | 1 385 221 | 1/2004 |
| JP | 07-142169 | 6/1995 |
| JP | 2000-053677 | 2/2000 |
| JP | 2000-273056 | 10/2000 |
| JP | 2001-097897 | 4/2001 |
| JP | 2001-335516 | 12/2001 |
| WO | WO 02/088274 | 11/2002 |
| WO | WO 03/007658 | 1/2003 |
| WO | WO 03/060956 | 7/2003 |

OTHER PUBLICATIONS

Patent Abstracts of Japan vol. 2000, No. 4, Aug. 31, 2000 & JP 2000 026324 Jan. 25, 2000.

(Continued)

*Primary Examiner*—Dawn L. Garrett
(74) *Attorney, Agent, or Firm*—Raymond L. Owens

(57) ABSTRACT

A white light-emitting OLED device including spaced anode and cathode, and having blue light-emitting and yellow, orange, or red light-emitting layers, the blue light-emitting layer including a monoanthracene derivative of Formula (I) as a host material:

(I)

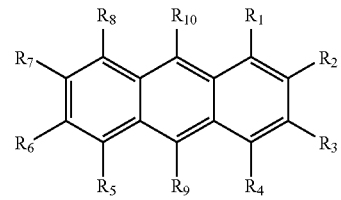

wherein $R_1$-$R_8$ are H; $R_9$ is not the same as $R_{10}$; $R_9$ is a naphthyl group having no fused rings with aliphatic carbon ring members; and $R_{10}$ is a biphenyl group having no fused rings with aliphatic carbon ring members; provided that $R_9$ and $R_{10}$ are free of amines and sulfur compounds.

30 Claims, 2 Drawing Sheets

U.S. PATENT DOCUMENTS

| | | | |
|---|---|---|---|
| 5,683,823 | A | 11/1997 | Shi et al. |
| 5,935,721 | A | 8/1999 | Shi et al. |
| 5,972,247 | A | 10/1999 | Shi et al. |
| 6,392,340 | B2 | 5/2002 | Yoneda et al. |
| 6,465,115 | B2 | 10/2002 | Shi et al. |
| 6,534,199 | B1 | 3/2003 | Hosokawa et al. |
| 6,582,837 | B1 | 6/2003 | Toguchi et al. |
| 6,713,192 | B2 * | 3/2004 | Fukuoka et al. ............ 428/690 |
| 6,803,120 | B2 * | 10/2004 | Fukuoka et al. ............ 428/690 |
| 2002/0048687 | A1 | 4/2002 | Hosokawa et al. |
| 2002/0136922 | A1 | 9/2002 | Sakai et al. |
| 2003/0198829 | A1 | 10/2003 | Hoag et al. |
| 2004/0018380 | A1 * | 1/2004 | Aziz et al. .................. 428/690 |

OTHER PUBLICATIONS

"Multilayer white light-emitting organic electroluminescent device" by Junji Kido et al., Science, vol. 267, Mar. 3, 1995, pp. 1332-1334.

"White light-emitting organic electroluminescent devices using the poly(N-vinylcarbazole) emitter layer doped with three fluorescent dyes" by J. Kido et al., Applied Physics Letter 64 (7) Feb. 14, 1994, pp. 815-817.

"White light-emitting organic electroluminescent devices based on interlayer sequential energy transfer" by R. S. Deshpande et al., Applied Physics Letters, Vol. 75, No. 7, Aug. 16, 1999, pp. 888-890.

* cited by examiner

ANTHRACENE DERIVATIVE HOST HAVING RANGES OF DOPANTS

CROSS REFERENCE TO RELATED APPLICATIONS

Reference is made to commonly assigned U.S. patent application Ser. No. 10/693,121 (now abandoned) filed Oct. 24, 2003 by Lelia Cosimbescu et al., entitled "Electroluminescent Device With Anthracene Derivative Host", the disclosure of which is herein incorporated by reference.

FIELD OF THE INVENTION

This invention relates to white light-emitting organic electroluminescent (EL) devices comprising a light-emitting layer containing a host and a dopant where the host comprises a monoanthracene compound with very good operational stability at room temperature and at 70° C. and with ranges of dopant materials.

BACKGROUND OF THE INVENTION

An organic light-emitting diode device, also called an OLED device, commonly includes a substrate, an anode, a hole-transporting layer made of an organic compound, an organic luminescent layer with suitable dopants, an organic electron-transporting layer, and a cathode. OLED devices are attractive because of their low driving voltage, high luminance, wide-angle viewing and capability for full-color flat emission displays. Tang et al. described this multilayer OLED device in their U.S. Pat. Nos. 4,769,292 and 4,885,211.

A white-emitting electroluminescent (EL) layer can be used to form a multicolor device. Each pixel is coupled with a color filter element as part of a color filter array (CFA) to achieve a pixilated multicolor display. The organic EL layer is common to all pixels and the final color as perceived by the viewer is dictated by that pixel's corresponding color filter element. Therefore, a multicolor or RGB device can be produced without requiring any patterning of the organic EL layers. An example of a white CFA top-emitting device is shown in U.S. Pat. No. 6,392,340.

White light producing OLED devices should be bright, efficient, and generally have Commission International d'Eclairage (CIE) chromaticity coordinates of about (0.33, 0.33). In any event, in accordance with this disclosure, white light is that light which is perceived by a user as having a white color. The following patents and publications disclose the preparation of organic OLED devices capable of producing white light, comprising a hole-transporting layer and an organic luminescent layer, and interposed between a pair of electrodes.

White light producing OLED devices have been reported by J. Shi (U.S. Pat. No. 5,683,823) wherein the luminescent layer includes red and blue light-emitting materials uniformly dispersed in a host-emitting material. Sato et al. in JP 07-142169 discloses an OLED device, capable of emitting white light, made by forming a blue light-emitting layer next to the hole-transporting layer and followed by a green light-emitting layer having a region containing a red fluorescent layer.

Kido et al., in *Science*, 267, 1332 (1995) and in *Applied Physics Letters*, 64, 815 (1994), report a white light-producing OLED device. In this device, three emitter layers with different carrier transport properties, each emitting blue, green, or red light, are used to generate white light. Littman et al. in U.S. Pat. No. 5,405,709 disclose another white emitting device, which is capable of emitting white light in response to hole-electron recombination, and comprises a fluorescent in a visible light range from bluish green to red. More recently, Deshpande et al., in *Applied Physics Letters*, 75, 888 (1999), published a white OLED device using red, blue, and green luminescent layers separated by a hole-blocking layer.

Anthracene based hosts are often used. A useful class of 9,10-di-(2-naphthyl)anthracene hosts has been disclosed in U.S. Pat. No. 5,935,721. Bis-anthracene compounds used in the luminescent layer with an improved device half-life have been disclosed in U.S. Pat. No. 6,534,199 and U.S. Patent Application Publication 2002/0136922 A1. Electroluminescent devices with improved luminance using anthracene compounds have been disclosed in U.S. Pat. No. 6,582,837. Anthracenes have also been used in the hole-transporting layer (HTL) as disclosed in U.S. Pat. No. 6,465,115. In addition, there are other disclosures of using anthracene materials in OLED devices, U.S. Pat. No. 5,972,247, JP 2001-097897, JP 2000-273056, U.S. Patent Application Publication 2002/0048687 A1, WO 03/060956 A2, WO 02/088274 A1, EP 0429821, WO 03/007658 A2, JP 2000-053677, and JP 2001-335516.

Despite these advances, there is a continuing need for hosts and dopants that provide better operational stability and are conveniently manufactured. Improved operational stability of OLED devices will permit their use in more products.

SUMMARY OF THE INVENTION

It has been found quite unexpectedly that by using certain monoanthracene derivatives as a host for blue dopants and having the blue dopants in the range of 0.25 to 5% by volume, improvements can be achieved in stability for a white light-emitting device with a yellow, orange, or red light-emitting layer and a blue light-emitting layer.

This object is achieved by a white light-emitting OLED device including spaced anode and cathode, and having blue light-emitting and yellow, orange, or red light-emitting layers, the blue light-emitting layer including a) a monoanthracene derivative of Formula (I) as a host material

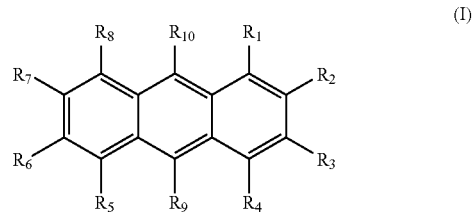

(I)

wherein:

$R_1$-$R_8$ are H;

$R_9$ is not the same as $R_{10}$;

$R_9$ is a naphthyl group having no fused rings with aliphatic carbon ring members; and $R_{10}$ is a biphenyl group having no fused rings with aliphatic carbon ring members; and provided that $R_9$ and $R_{10}$ are free of amines and sulfur compounds.

ADVANTAGES

It is an advantage of the present invention that a white light-emitting OLED device can be prepared with improved stability without sacrificing efficiency. It is a further advantage that this invention reduces hue shifts of an OLED device due to increasing current density.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "pixel" is employed in its art-recognized usage to designate an area of a display panel that can be stimulated to emit light independently of other areas. The term "OLED device" or "organic light-emitting display" is used in its art-recognized meaning of a display device comprising organic light-emitting diodes as pixels. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of emitting in the red, green, and blue regions of the visible spectrum and displaying images in any combination of hues. The red, green, and blue colors constitute the three primary colors from which all other colors can be generated by appropriate mixing. The term "hue" refers to the intensity profile of light emission within the visible spectrum, with different hues exhibiting visually discernible differences in color. The pixel or subpixel is generally used to designate the smallest addressable unit in a display panel. For a monochrome display, there is no distinction between pixel and subpixel. The term "subpixel" is used in multicolor display panels and is employed to designate any portion of a pixel, which can be independently addressable to emit a specific color. For example, a blue subpixel is that portion of a pixel which can be addressed to emit blue light. In a full-color display, a pixel generally comprises three primary-color subpixels, namely blue, green, and red. The term "pitch" is used to designate the distance separating two pixels or subpixels in a display panel. Thus, a subpixel pitch means the separation between two subpixels.

Figure 1:
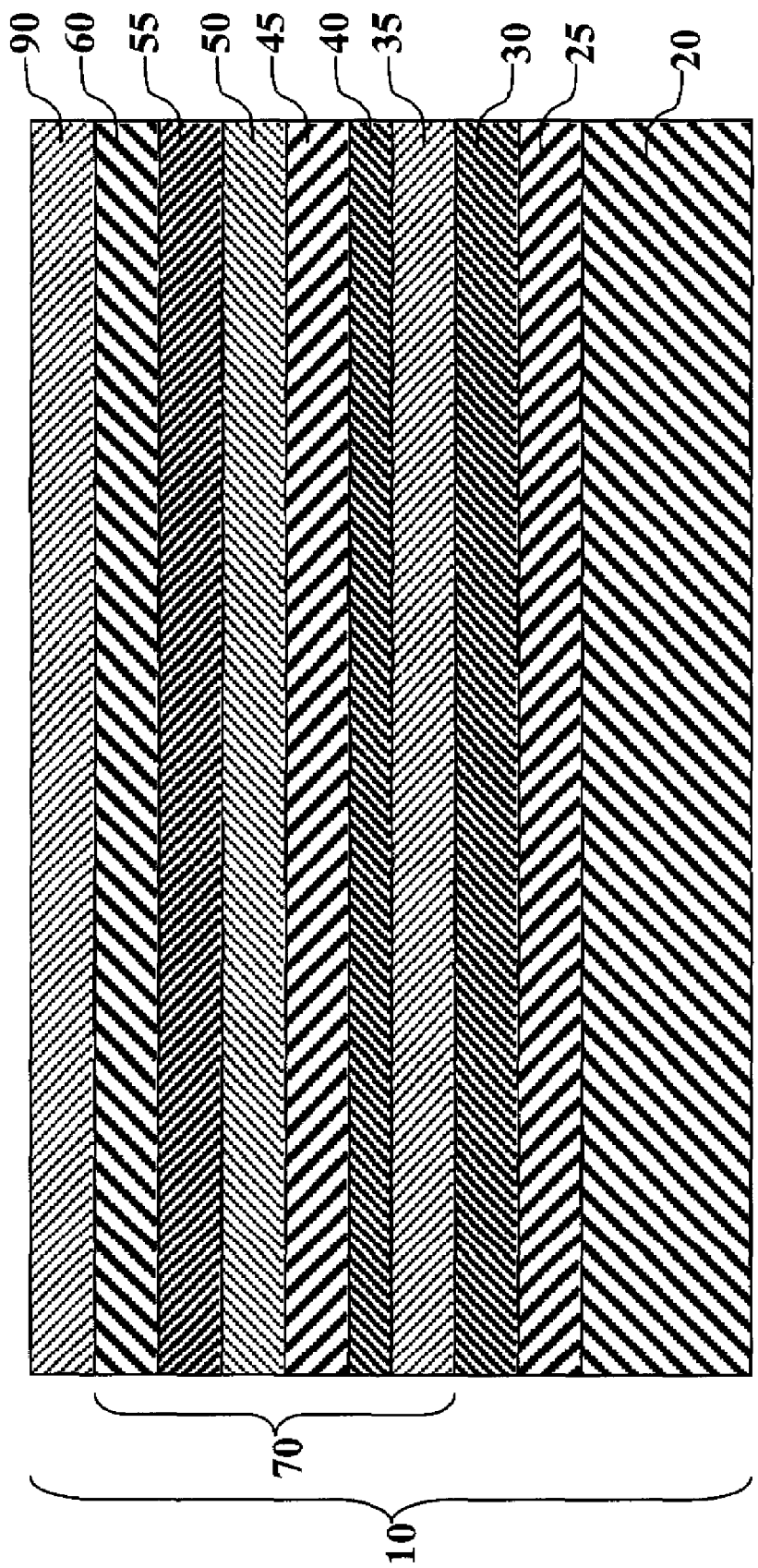
FIG. 1 is a cross-sectional view of an OLED device according to a first embodiment of this invention.

Turning now to FIG. 1, there is shown a cross-sectional view of a pixel of a white light-emitting OLED device 10 that can be used according to a first embodiment of the present invention. Such an OLED device can be incorporated into e.g. a display or an area lighting system. The OLED device 10 includes at a minimum a substrate 20, an anode 30, a cathode 90 spaced from anode 30, a first light-emitting layer 45, and a second adjacent light-emitting layer 50. One of adjacent light-emitting layers 45 and 50 is a blue light-emitting layer, and the other is a yellow, orange, or red light-emitting layer. For the purposes of discussion, first light-emitting layer 45 shall be the blue light-emitting layer, but it will be understood that second light-emitting layer 50 can be the blue light-emitting layer. It has been found in commonly assigned U.S. patent application Ser. No. 10/693,121 filed Oct. 24, 2003 by Lelia Cosimbescu et al., entitled "Electroluminescent Device With Anthracene Derivative Host", the disclosure of which is herein incorporated by reference, that certain unsymmetrical anthracenes are extremely useful in OLED devices that exhibit high efficiencies. These compounds have been found to be particularly useful in blue light-emitting layers of OLED devices that produce white light. Blue light-emitting layer 45 includes a monoanthracene derivative of Formula (I) as a host material

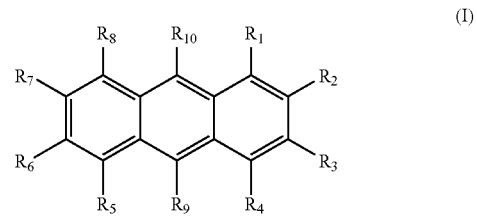

(I)

wherein:

$R_1$-$R_8$ are H; and $R_9$ is a naphthyl group containing no fused rings with aliphatic carbon ring members; provided that $R_9$ and $R_{10}$ are not the same, and are free of amines and sulfur compounds. Suitably, $R_9$ is a substituted naphthyl group with one or more further fused rings such that it forms a fused aromatic ring system, such as a phenanthryl, pyrenyl, fluoranthene, perylene, or substituted with one or more substituents such as fluorine, cyano group, hydroxy, alkyl, alkoxy, aryloxy, aryl, a heterocyclic oxy group, carboxy, trimethylsilyl group, or an unsubstituted naphthyl group of two fused rings. Conveniently, $R_9$ is 2-naphthyl, or 1-naphthyl substituted or unsubstituted in the para position; and $R_{10}$ is a biphenyl group having no fused rings with aliphatic carbon ring members. Suitably $R_{10}$ is a substituted biphenyl group, such that is forms a fused aromatic ring system including but not limited to a naphthyl, phenanthryl, perylene, or substituted with one or more substituents such as fluorine, cyano group, hydroxy, alkyl, alkoxy, aryloxy, aryl, a heterocyclic oxy group, carboxy, trimethylsilyl group, or an unsubstituted biphenyl group. Conveniently, $R_{10}$ is 4-biphenyl, 3-biphenyl unsubstituted or substituted with another phenyl ring without fused rings to form a terphenyl ring system, or 2-biphenyl.

Useful host materials of this invention include:
Host-1
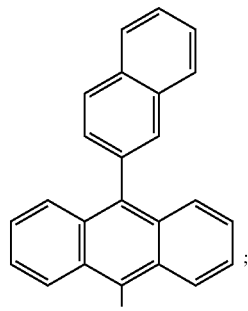
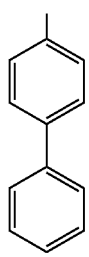
Host-2
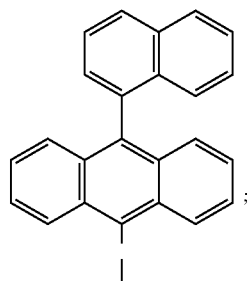
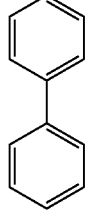
Host-3
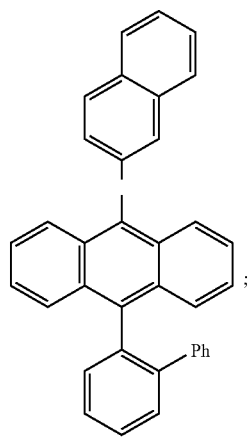
Host-4
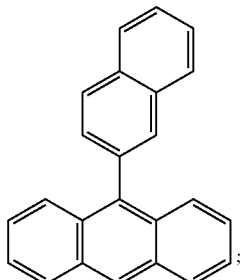
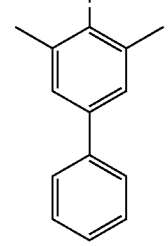
Host-5
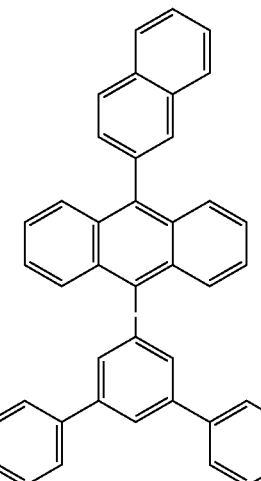
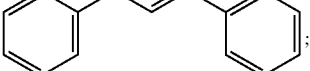
Host-6
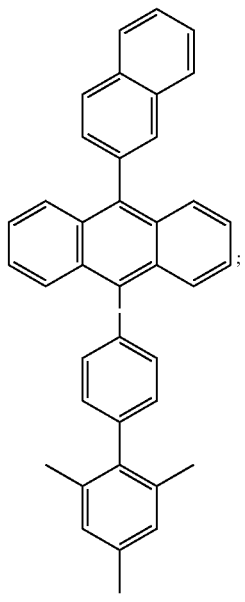

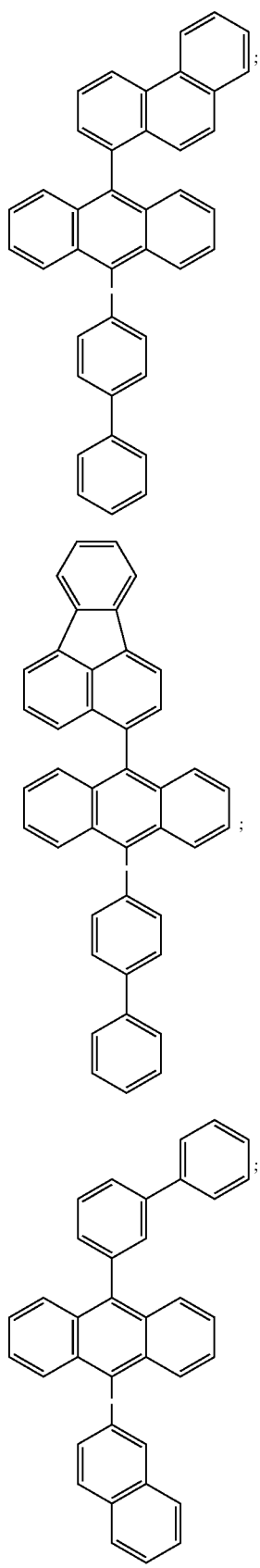
Host-7
Host-8
Host-9
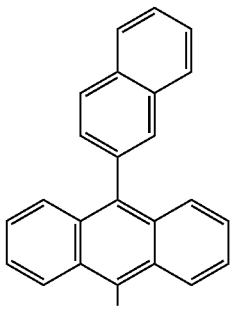
Host-10
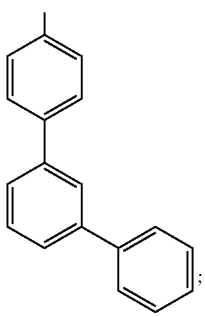
Host-11
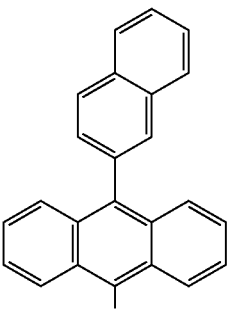
Host-12
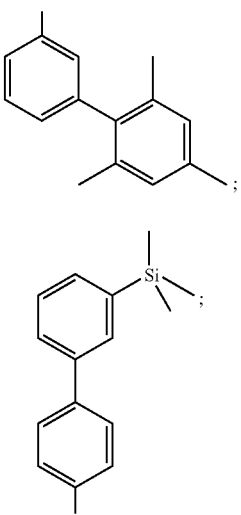

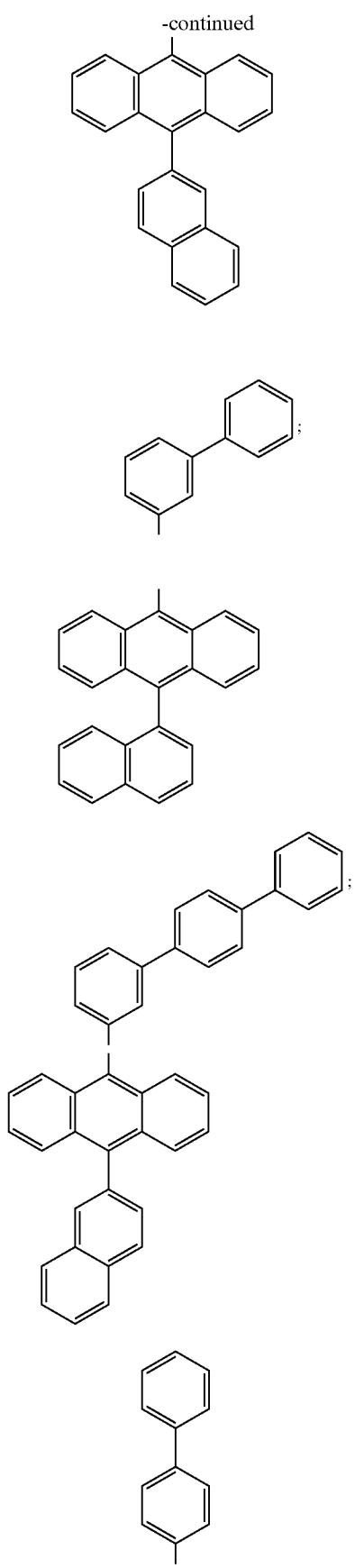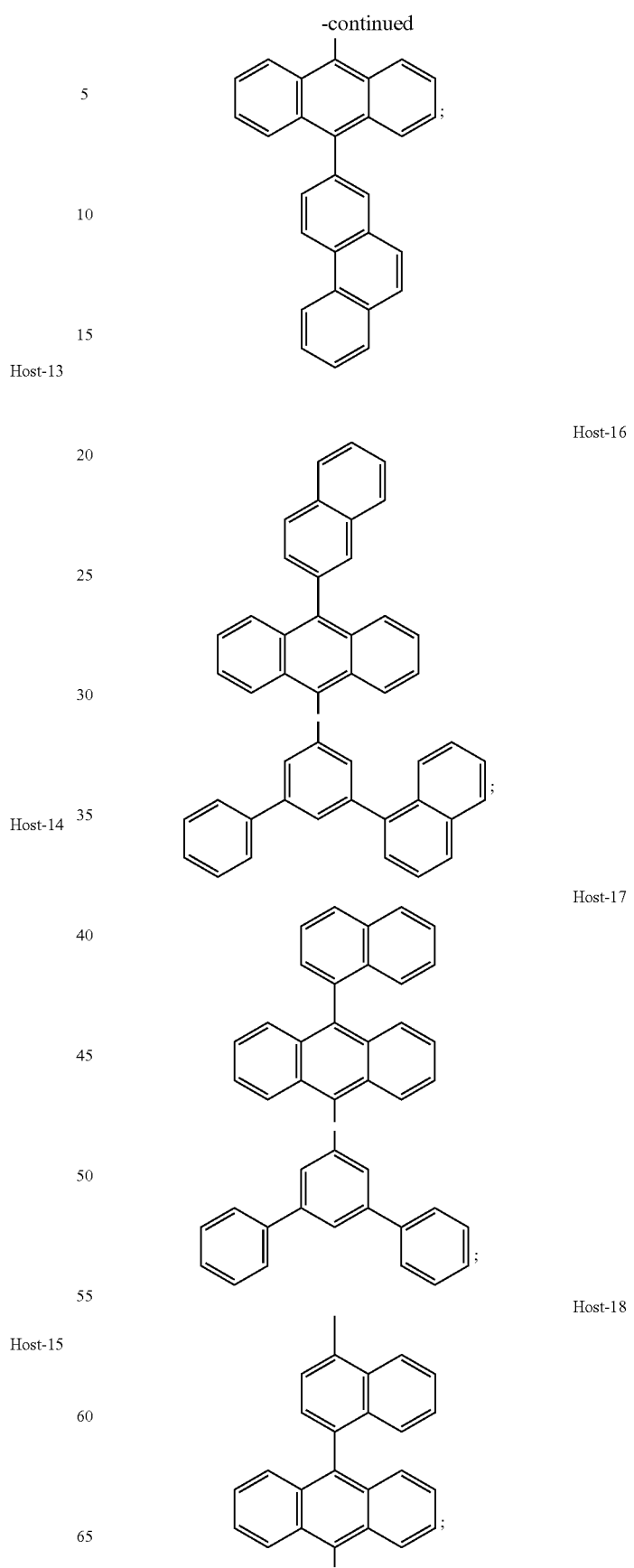

Host-19

Host-20

Host-21

Host-22

Host-23

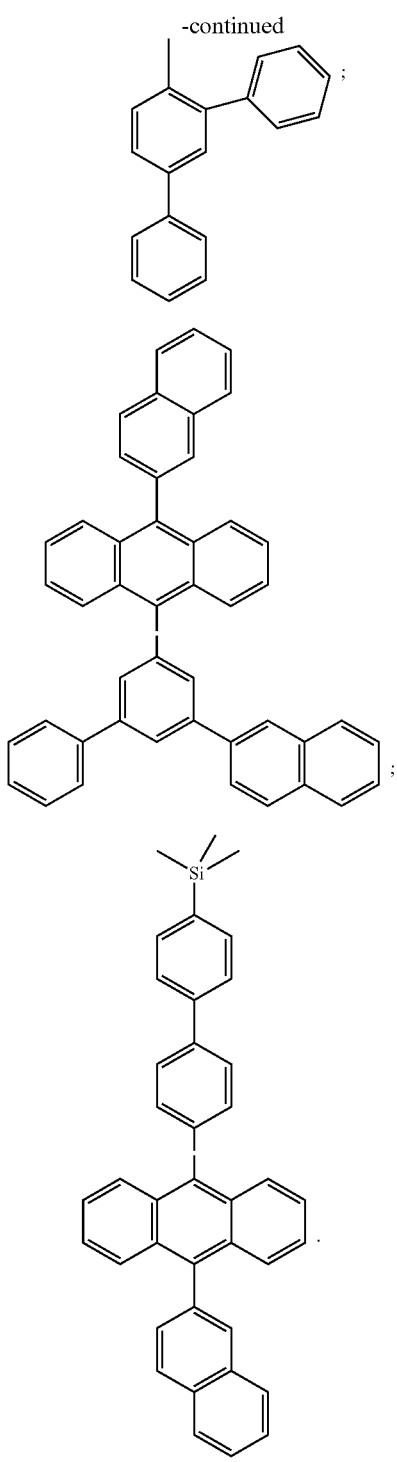

Particularly useful is 9-(2-naphthyl)-10-(4-biphenyl)anthracene (Host-1).

Host materials of the invention are employed in blue light-emitting layer 45 comprising a certain thickness, together with a dopant or light-emitting guest material as defined below. The host of the invention can be used in combination with other blue or green co-host to improve the stability of a certain application. The co-host can be a small molecule or a polymeric material. Useful co-hosts include, but are not limited to, polyfluorenes, polyvinylarylenes, metal complexes of oxinoid compounds such as 8-hydroxyquinoline, benzazole derivatives, distyrylarylenes, and carbazoles. Suitably, the co-host is tris(8-quinolinolato)aluminum(III) (Alq).

It is an advantage of the hosts of the invention that they are free of sulfur and amines. The process of preparing the materials as well as their purification is simple and efficient and environmentally friendly, thus making these compounds conveniently manufacturable.

The blue light-emitting dopant in blue light-emitting layer 45 is from 0.25 to 5% by volume of the host material and can include perylene or derivatives thereof, blue-emitting derivatives of distyrylbenzene or a distyrylbiphenyl, or a compound of the structure M1

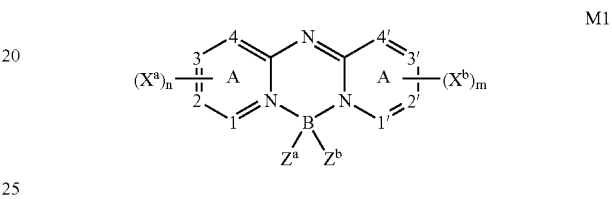

wherein:

A and A' represent independent azine ring systems corresponding to 6-membered aromatic ring systems containing at least one nitrogen;

$(X^a)_n$ and $(X^b)_m$ represent one or more independently selected substituents and include acyclic substituents or are joined to form a ring fused to A or A';

m and n are independently 0 to 4;

$Z^a$ and $Z^b$ are independently selected substituents;

1, 2, 3, 4, 1', 2', 3', and 4' are independently selected as either carbon or nitrogen atoms; and provided that $X^a$, $X^b$, $Z^a$, and $Z^b$, 1, 2, 3, 4, 1', 2', 3', and 4' are selected to provide blue luminescence.

Some examples of the above class of dopants include the following:

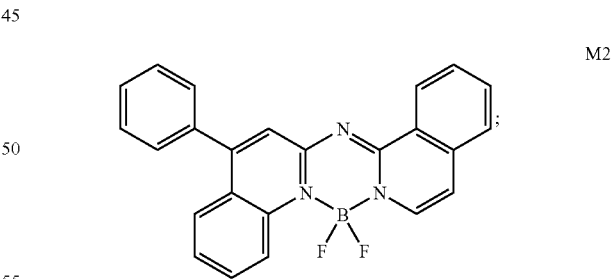

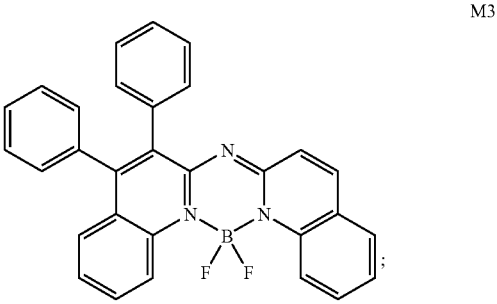

-continued

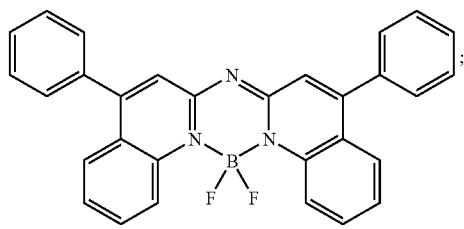
M4

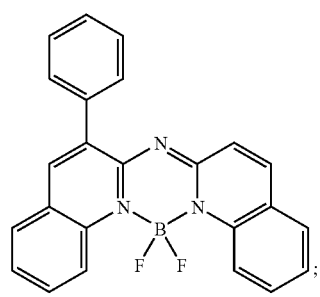
M5

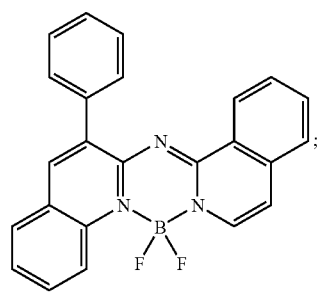
M6

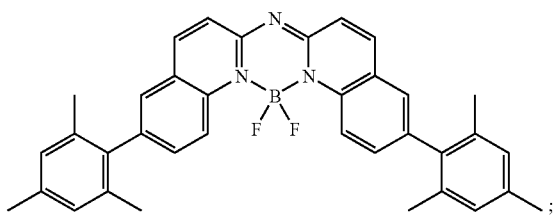
(BEP); M7 or

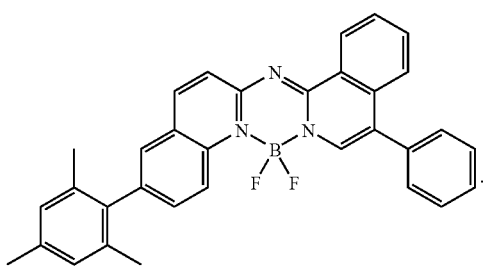
M8

Another particularly useful class of blue dopants in this invention includes blue-emitting derivatives of such distyrylarenes as distyrylbenzene and distyrylbiphenyl, including compounds described in U.S. Pat. No. 5,121,029. Among derivatives of distyrylarenes that provide blue luminescence, particularly useful are those substituted with diarylamino groups, also known as distyrylamines. Examples include bis[2-[4-[N,N-diarylamino]phenyl]vinyl]-benzenes of the general structure N1 shown below:

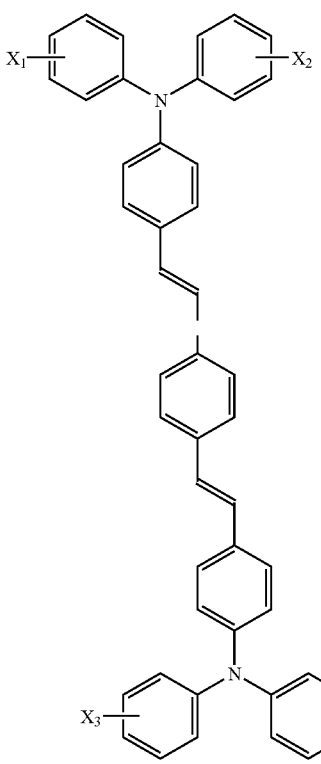
N1 and bis[2-[4-[N,N-diarylamino]phenyl]vinyl]biphenyls of the general structure N2 shown below:

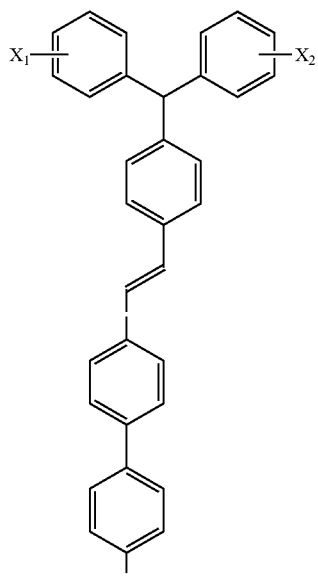
N2

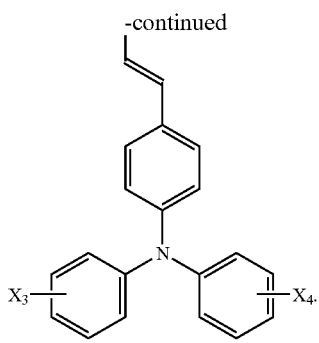

In Formulas N1 and N2, $X_1$-$X_4$ can be the same or different, and individually represent one or more substituents such as alkyl, aryl, fused aryl, halo, or cyano. In a preferred embodiment, $X_1$-$X_4$ are individually alkyl groups, each containing from one to about ten carbon atoms. A particularly preferred blue dopant of this class is 1,4-bis[2-[4-[N,N-di(p-tolyl)amino]phenyl]vinyl]benzene (BD-TAPVB, Formula L47)

L47

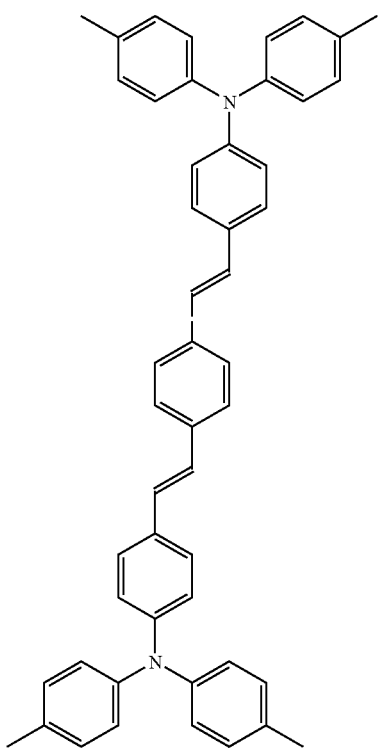

Particularly useful blue dopants of the perylene class include perylene (L1) and tetra-t-butylperylene (TBP, L2)

L1

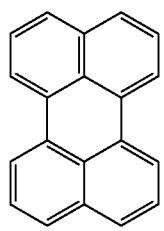

L2

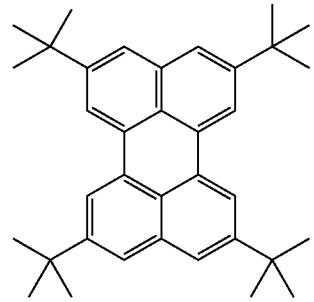

Substrate 20 can be an organic solid, an inorganic solid, or can include organic and inorganic solids. Substrate 20 can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof. Substrate 20 can be a homogeneous mixture of materials, a composite of materials, or multiple layers of materials. Substrate 20 can be an OLED substrate, that is a substrate commonly used for preparing OLED devices, e.g., active-matrix low-temperature polysilicon or amorphous-silicon TFT substrate. The substrate 20 can either be light transmissive or opaque, depending on the intended direction of light emission. The light transmissive property is desirable for viewing the EL emission through the substrate. Transparent glass or plastic are commonly employed in such cases. For applications where the EL emission is viewed through the top electrode, the transmissive characteristic of the bottom support is immaterial, and therefore can be light transmissive, light absorbing, or light reflective. Substrates for use in this case include, but are not limited to, glass, plastic, semiconductor materials, ceramics, and circuit board materials, or any others commonly used in the formation of OLED devices, which can be either passive-matrix devices or active-matrix devices.

An electrode is formed over substrate 20 and is most commonly configured as an anode 30. When EL emission is viewed through the substrate 20, anode 30 should be transparent, or substantially transparent, to the emission of interest. Common transparent anode materials useful in this invention are indium-tin oxide and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, metal selenides such as zinc selenide, and metal sulfides such as zinc sulfide, can be used as an anode material. For applications where EL emission is viewed through the top electrode, the transmissive characteristics of the anode material are immaterial and any conductive material can be used, transparent, opaque or reflective. Example conductors for this application include, but are not limited to, gold, iridium, molybdenum, palladium, and platinum. The preferred anode materials, transmissive or otherwise, have a work function of 4.1 eV or greater. Desired anode materials can be deposited by any suitable ways such as evaporation, sputtering, chemical vapor deposition, or electrochemical means. Anode materials can be patterned using well known photolithographic processes.

Cathode 90 is formed over the electron-transporting layer 55 or over light-emitting layer 50 if an electron-transporting layer is not used. When light emission is through the anode 30, the cathode material can be comprised of nearly any conductive material. Desirable materials have good film-forming properties to ensure good contact with the underlying organic layer, promote electron injection at low voltage, and have good stability. Useful cathode materials often contain a low work function metal (<3.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. Nos. 5,059,861, 5,059,862, and 6,140,763.

When light emission is viewed through cathode 90, it must be transparent or nearly transparent. For such applications, metals must be thin or one must use transparent conductive oxides, including these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Cathode 90 is spaced, meaning it is vertically spaced apart from anode 30. Cathode 90 can be part of an active matrix device and, in that case, is a single electrode for the entire display. Alternatively, cathode 90 can be part of a passive matrix device, in which each cathode 90 can activate a column of pixels, and cathodes 90 are arranged orthogonal to anodes 30.

Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

OLED device 10 can also include color filter 25, a hole-injecting layer 35, a hole-transporting layer 40, an electron-transporting layer 55, and an electron-injecting layer 60. Hole-injecting layer 35, hole-transporting layer 40, light-emitting layers 45 and 50, electron-transporting layer 55, and electron-injecting layer 60 comprise organic EL element 70 that is disposed between anode 30 and cathode 90 and that for the purposes of this invention includes at least two different dopants for collectively emitting white light. These components will be described in more detail.

While not always necessary, it is often useful that a hole-injecting layer 35 be formed over anode 30 in an organic light-emitting display. The hole-injecting material can serve to improve the film formation property of subsequent organic layers and to facilitate injection of holes into the hole-transporting layer. Suitable materials for use in hole-injecting layer 35 include, but are not limited to, porphyrinic compounds as described in U.S. Pat. No. 4,720,432, plasma-deposited fluorocarbon polymers as described in U.S. Pat. No. 6,208,075, and inorganic oxides including vanadium oxide (VOx), molybdenum oxide (MoOx), nickel oxide (NiOx), etc. Alternative hole-injecting materials reportedly useful in organic EL devices are described in EP 0 891 121 A1 and EP 1 029 909 A1.

While not always necessary, it is often useful that a hole-transporting layer 40 be formed and disposed over anode 30. Desired hole-transporting materials can be deposited by any suitable way such as evaporation, sputtering, chemical vapor deposition, electrochemical means, thermal transfer, or laser thermal transfer from a donor material. Hole-transporting materials useful in hole-transporting layer 40 are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula A

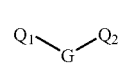

A wherein:

Q₁ and Q₂ are independently selected aromatic tertiary amine moieties; and

G is a linking group such as an arylene, cycloalkylene, or alkylene group of a carbon to carbon bond.

In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural Formula A and containing two triarylamine moieties is represented by structural Formula B

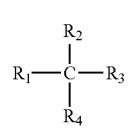

B where:

$R_1$ and $R_2$ each independently represent a hydrogen atom, an aryl group, or an alkyl group, or $R_1$ and $R_2$ together represent the atoms completing a cycloalkyl group; and $R_3$ and $R_4$ each independently represent an aryl group, which is in turn substituted with a diaryl substituted amino group, as indicated by structural Formula C

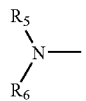

wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by Formula C, linked through an arylene group. Useful tetraaryldiamines include those represented by Formula D

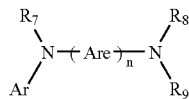

wherein:
each Are is an independently selected arylene group, such as a phenylene or anthracene moiety;
n is an integer of from 1 to 4; and
Ar, $R_7$, $R_8$, and $R_9$ are independently selected aryl groups.

In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms, e.g. cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compounds. Specifically, one can employ a triarylamine, such as a triarylamine satisfying the Formula B, in combination with a tetraaryldiamine, such as indicated by Formula D. When a triarylamine is employed in combination with a tetraaryldiamine, the latter is positioned as a layer interposed between the triarylamine and the electron-injecting and transporting layer. Illustrative of useful aromatic tertiary amines are the following:
1,1-Bis(4-di-p-tolylaminophenyl)cyclohexane;
1,1-Bis(4-di-p-tolylaminophenyl)-4-phenylcyclohexane;
4,4'-Bis(diphenylamino)quadriphenyl;
Bis(4-dimethylamino-2-methylphenyl)-phenylmethane;
N,N,N-Tri(p-tolyl)amine;
4-(di-p-tolylamino)-4'-[4(di-p-tolylamino)-styryl]stilbene;
N,N,N',N'-Tetra-p-tolyl-4-4'-diaminobiphenyl;
N,N,N',N'-Tetraphenyl-4,4'-diaminobiphenyl;
N-Phenylcarbazole;
Poly(N-vinylcarbazole);
N,N'-di-1-naphthalenyl-N,N'-diphenyl-4,4'-diaminobiphenyl;
4,4'-Bis[N-(1-naphthyl)-N-phenylamino]biphenyl;
4,4"-Bis[N-(1-naphthyl)-N-phenylamino]p-terphenyl;
4,4'-Bis[N-(2-naphthyl)-N-phenylamino]biphenyl;
4,4'-Bis[N-(3-acenaphthenyl)-N-phenylamino]biphenyl;
1,5-Bis[N-(1-naphthyl)-N-phenylamino]naphthalene;
4,4'-Bis[N-(9-anthryl)-N-phenylamino]biphenyl;
4,4"-Bis[N-(1-anthryl)-N-phenylamino]-p-terphenyl;
4,4'-Bis[N-(2-phenanthryl)-N-phenylamino]biphenyl;
4,4'-Bis[N-(8-fluoranthenyl)-N-phenylamino]biphenyl;
4,4'-Bis[N-(2-pyrenyl)-N-phenylamino]biphenyl;
4,4'-Bis[N-(2-naphthacenyl)-N-phenylamino]biphenyl;
4,4'-Bis[N-(2-perylenyl)-N-phenylamino]biphenyl;
4,4'-Bis[N-(1-coronenyl)-N-phenylamino]biphenyl;
2,6-Bis(di-p-tolylamino)naphthalene;
2,6-Bis[di-(1-naphthyl)amino]naphthalene;
2,6-Bis[N-(1-naphthyl)-N-(2-naphthyl)amino]naphthalene;
N,N,N',N'-Tetra(2-naphthyl)-4,4"-diamino-p-terphenyl;
4,4'-Bis{N-phenyl-N-[4-(1-naphthyl)-phenyl]amino}biphenyl;
4,4'-Bis[N-phenyl-N-(2-pyrenyl)amino]biphenyl;
2,6-Bis[N,N-di(2-naphthyl)amine]fluorene; and
1,5-Bis[N-(1-naphthyl)-N-phenylamino]naphthalene.

Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-emitting layer 50 produces light in response to hole-electron recombination. Yellow, orange, or red light-emitting layer 50 is adjacent to blue light-emitting layer 45. Desired organic light-emitting materials can be deposited by any suitable way such as evaporation, sputtering, chemical vapor deposition, electrochemical means, or radiation thermal transfer from a donor material. Useful organic light-emitting materials are well known. As more fully described in U.S. Pat. Nos. 4,769,292 and 5,935,721, the light-emitting layers of the organic EL element comprise a luminescent or fluorescent material where electroluminescence is produced as a result of electron-hole pair recombination in this region. Light-emitting layer 50 can be comprised of a single material, but more commonly include a host material doped with a guest compound or dopant where light emission comes primarily from the dopant.

The dopant is selected to produce color light having a particular spectrum in the yellow to red region. The host materials in the light-emitting layers can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host material to the dopant molecule, a necessary condition is that the band gap of the dopant is smaller than that of the host material.

Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g. green, yellow, orange, and red.

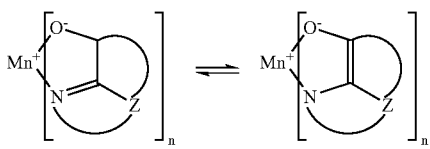

E wherein:

M represents a metal;

n is an integer of from 1 to 3; and

Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function, the number of ring atoms is usually maintained at 18 or less.

Illustrative of useful chelated oxinoid compounds are the following:

CO-1: Aluminum trisoxine[alias, tris(8-quinolinolato)aluminum(III)];

CO-2: Magnesium bisoxine[alias, bis(8-quinolinolato)magnesium(II)];

CO-3: Bis[benzo{f}-8-quinolinolato]zinc (II);

CO-4: Bis(2-methyl-8-quinolinolato)aluminum(III)-μ-oxo-bis(2-methyl-8-quinolinolato)aluminum(III);

CO-5: Indium trisoxine[alias, tris(8-quinolinolato)indium];

CO-6: Aluminum tris(5-methyloxine)[alias, tris(5-methyl-8-quinolinolato)aluminum(III)];

CO-7: Lithium oxine[alias, (8-quinolinolato)lithium(I)];

CO-8: Gallium oxine[alias, tris(8-quinolinolato)gallium (III)]; and

CO-9: Zirconium oxine[alias, tetra(8-quinolinolato)zirconium(IV)].

The host material in light-emitting layer 50 can be an anthracene derivative having hydrocarbon or substituted hydrocarbon substituents at the 9 and 10 positions. For example, derivatives of 9,10-di-(2-naphthyl)anthracene (Formula F) constitute one class of useful host materials capable of supporting electroluminescence, and are particularly suitable for light emission of wavelengths longer than 400 nm, e.g., blue, green, yellow, orange or red.

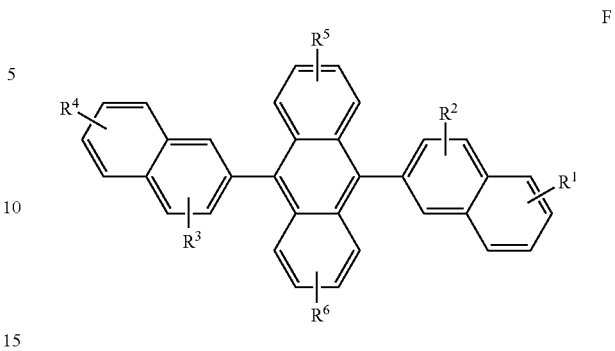

F wherein $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl, pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Benzazole derivatives (Formula G) constitute another class of useful host materials capable of supporting electroluminescence, and are particularly suitable for light emission of wavelengths longer than 400 nm, e.g., blue, green, yellow, orange or red.

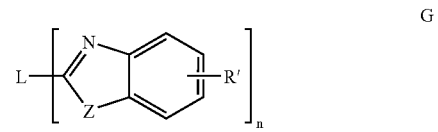

G where:

n is an integer of 3 to 8;

Z is O, NR or S;

R' is hydrogen; alkyl of from 1 to 24 carbon atoms, for example, propyl, t-butyl, heptyl, and the like; aryl or heteroatom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and L is a linkage unit including alkyl, aryl, substituted alkyl, or substituted aryl, which conjugately or unconjugately connects the multiple benzazoles together.

An example of a useful benzazole is 2,2',2''-(1,3,5-phenylene)tris[1-phenyl-1H-benzimidazole].

Desirable fluorescent dopants include perylene or derivatives of perylene, derivatives of anthracene, tetracene, xanthene, rubrene, coumarin, rhodamine, quinacridone, dicya nomethylenepyran compounds, thiopyran compounds, polymethine compounds, pyrilium and thiapyrilium compounds, derivatives of distryrylbenzene or distyrylbiphenyl, bis(azinyl)methane boron complex compounds, and carbostyryl compounds. Illustrative examples of useful dopants include, but are not limited to, the following:
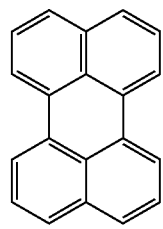
L1
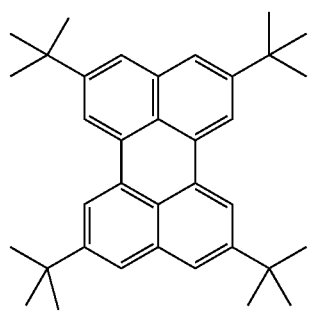
L2
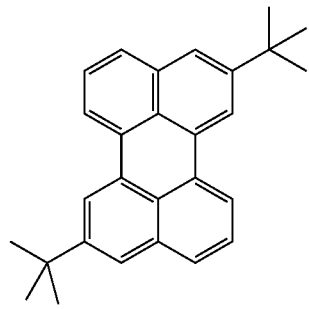
L3
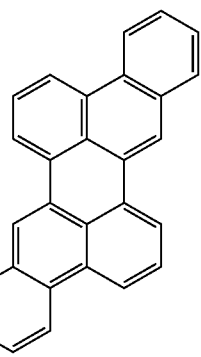
L4
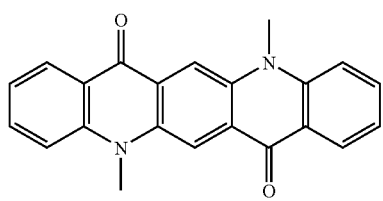
L5
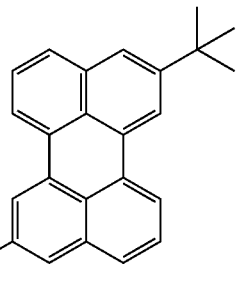
L6
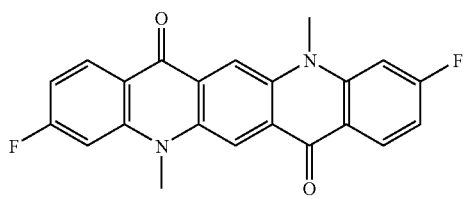
L7
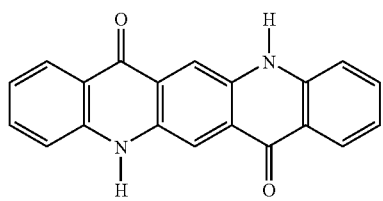
L8

-continued

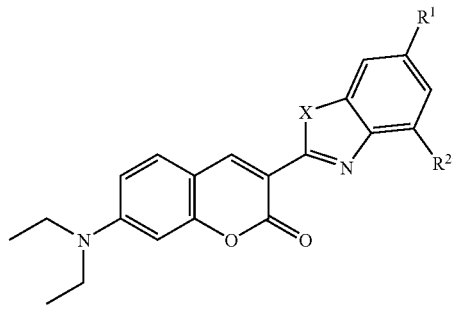

|     | X | R1     | R2     |
|-----|---|--------|--------|
| L9  | O | H      | H      |
| L10 | O | H      | Methyl |
| L11 | O | Methyl | H      |
| L12 | O | Methyl | Methyl |
| L13 | O | H      | t-butyl |
| L14 | O | t-butyl | H     |
| L15 | O | t-butyl | t-butyl |
| L16 | S | H      | H      |
| L17 | S | H      | Methyl |
| L18 | S | Methyl | H      |
| L19 | S | Methyl | Methyl |
| L20 | S | H      | t-butyl |
| L21 | S | t-butyl | H     |
| L22 | S | t-butyl | t-butyl |

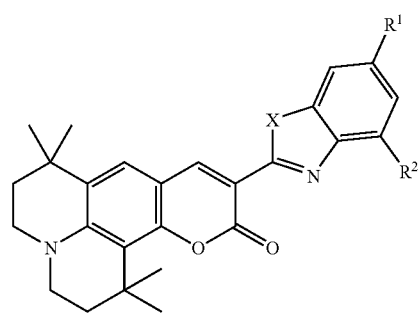

|     | X | R1     | R2     |
|-----|---|--------|--------|
| L23 | O | H      | H      |
| L24 | O | H      | Methyl |
| L25 | O | Methyl | H      |
| L26 | O | Methyl | Methyl |
| L27 | O | H      | t-butyl |
| L28 | O | t-butyl | H     |
| L29 | O | t-butyl | t-butyl |
| L30 | S | H      | H      |
| L31 | S | H      | Methyl |
| L32 | S | Methyl | H      |
| L33 | S | Methyl | Methyl |
| L34 | S | H      | t-butyl |
| L35 | S | t-butyl | H     |
| L36 | S | t-butyl | t-butyl |

-continued

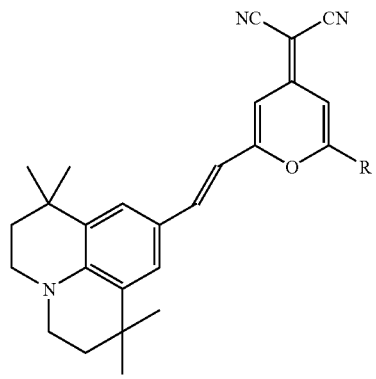

|     | R       |
|-----|---------|
| L37 | phenyl  |
| L38 | methyl  |
| L39 | t-butyl |
| L40 | mesityl |

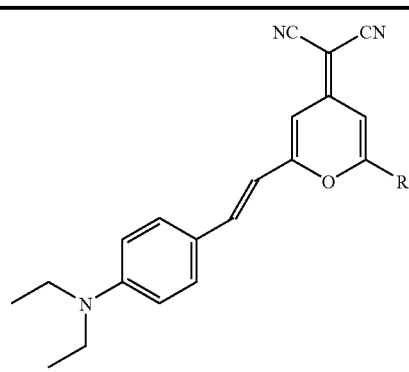

|     | R       |
|-----|---------|
| L41 | phenyl  |
| L42 | methyl  |
| L43 | t-butyl |
| L44 | mesityl |

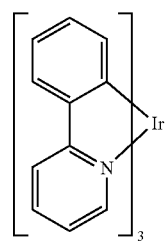

L45

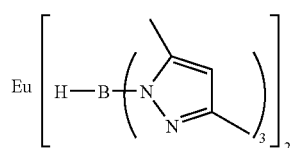

L46

-continued

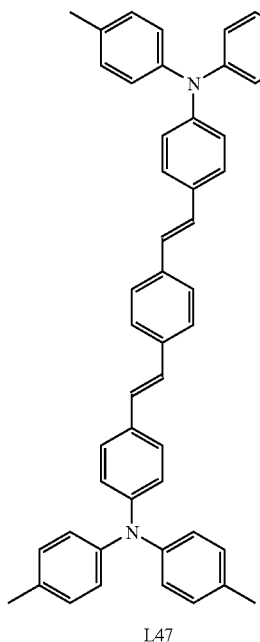

L47

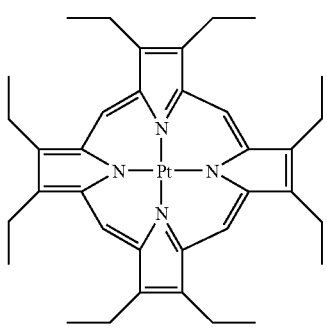

L48

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references cited therein.

Certain yellow, orange, and red emissive materials can be particularly useful for this invention. A light-emitting yellow dopant can include a compound of the following structures:

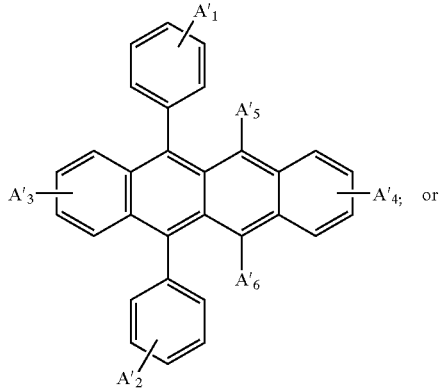

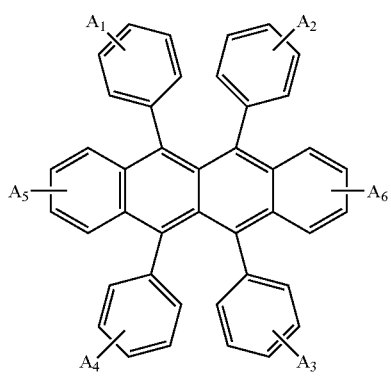

wherein $A_1$-$A_6$ represent one or more substituents on each ring and where each substituent is individually selected from one of the following:

Category 1: hydrogen, or alkyl of from 1 to 24 carbon atoms;

Category 2: aryl or substituted aryl of from 5 to 20 carbon atoms;

Category 3: hydrocarbon containing 4 to 24 carbon atoms, completing a fused aromatic ring or ring system;

Category 4: heteroaryl or substituted heteroaryl of from 5 to 24 carbon atoms such as thiazolyl, furyl, thienyl, pyridyl, quinolinyl or other heterocyclic systems, which are bonded via a single bond, or complete a fused heteroaromatic ring system;

Category 5: alkoxylamino, alkylamino, or arylamino of from 1 to 24 carbon atoms; or Category 6: fluoro, chloro, bromo or cyano.

Examples of particularly useful yellow dopants include 5,6,11,12-tetraphenylnaphthacene (rubrene); 6,11-diphenyl-5,12-bis(4-(6-methyl-benzothiazol-2-yl)phenyl)naphthacene (DBzR) and 5,6,11,12-tetra(2-naphthyl)naphthacene (NR), the formulas of which are shown below:

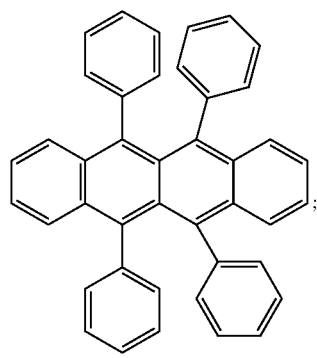
(Rubrene, P3)
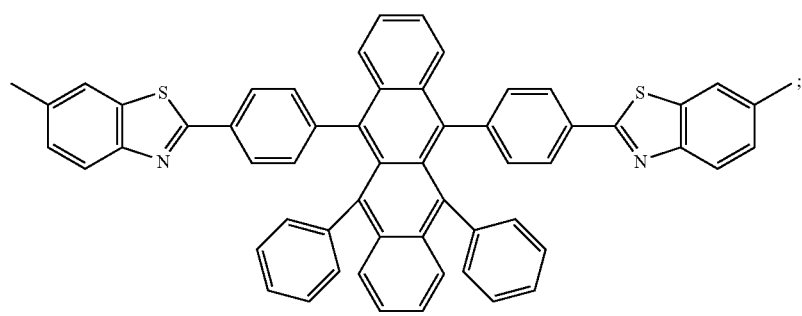
(DBzR, P4)
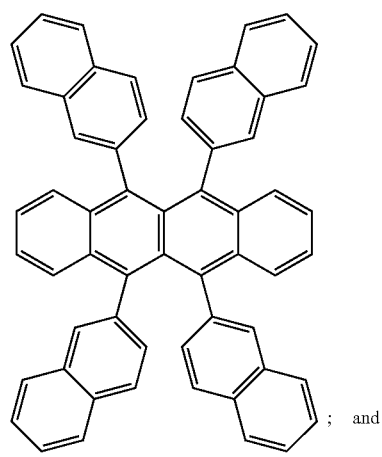
(NR, P5); and
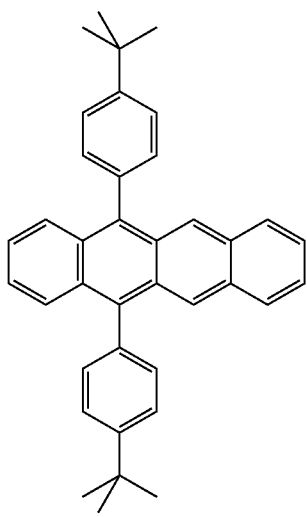
(tBuDPN, P6).
The yellow dopant can also be a mixture of compounds that would also be yellow dopants individually.
A light-emitting red dopant can include a diindenoperylene compound of the following structure Q1:
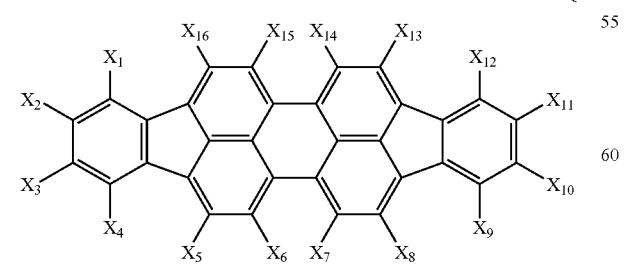
Q1 wherein:
X$_1$-X$_{16}$ are independently selected as hydro or substituents that provide red luminescence.
Illustrative examples of useful red dopants of this class include the following:
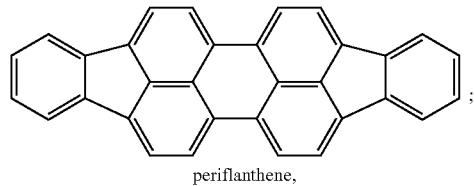
periflanthene,
Q2
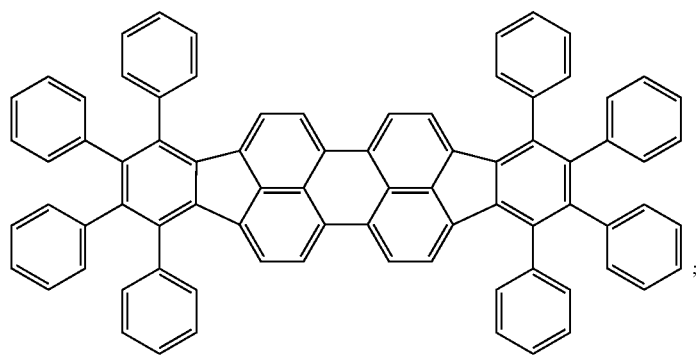
Q3
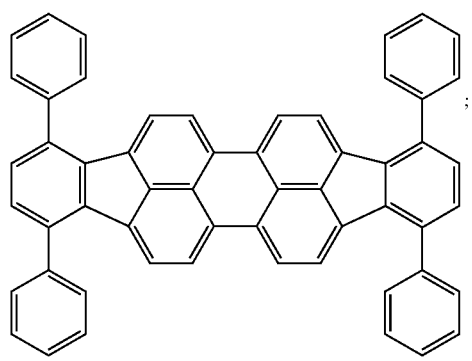
Q4
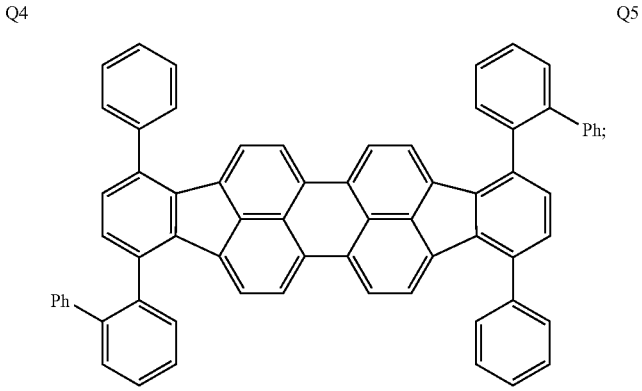
Q5
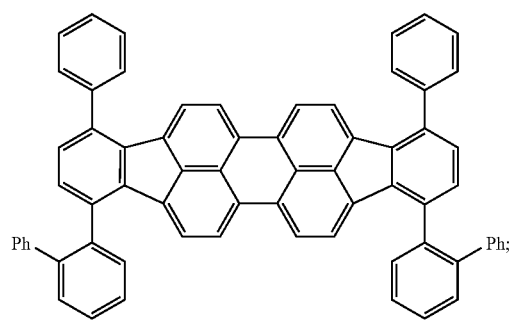
Q6
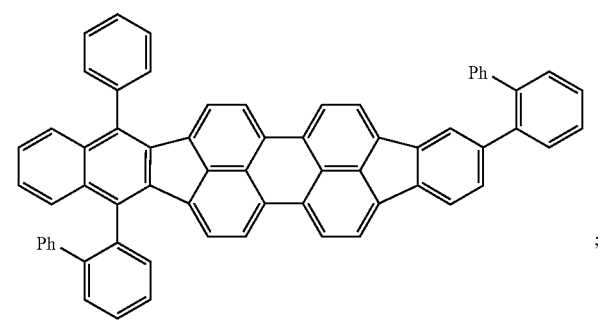
Q7

-continued
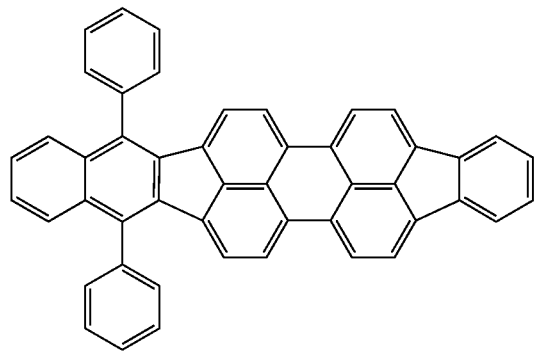
Q8
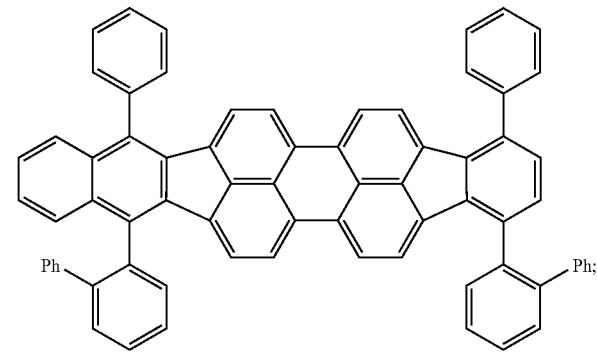
Q9
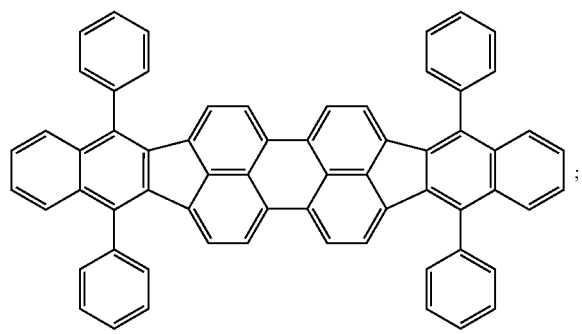
TPDBP,
Q10
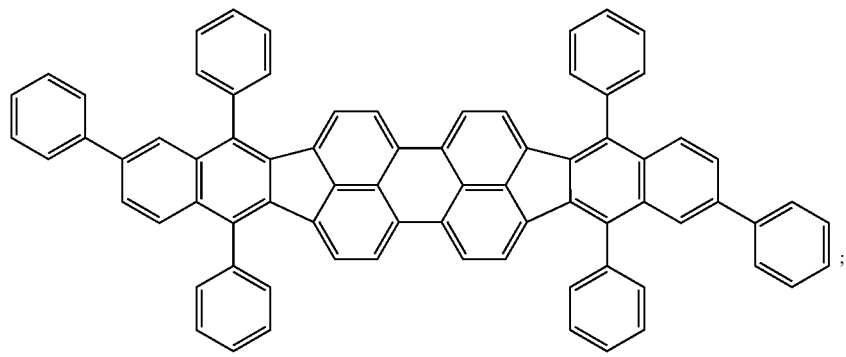
Q11
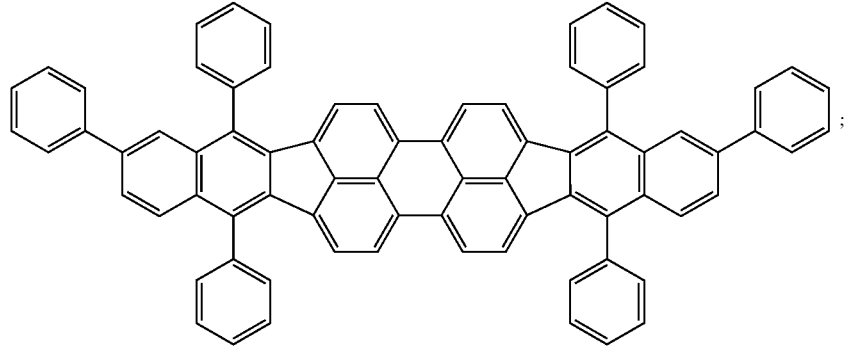
Q12

-continued
Q13
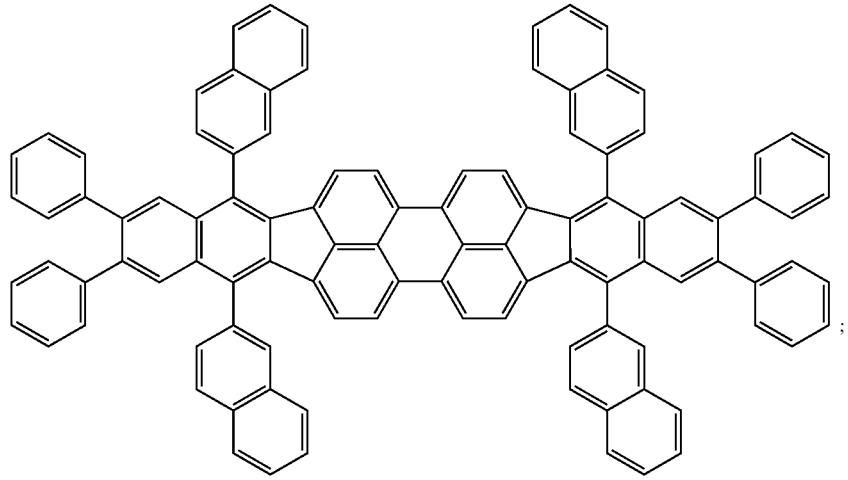;
Q14
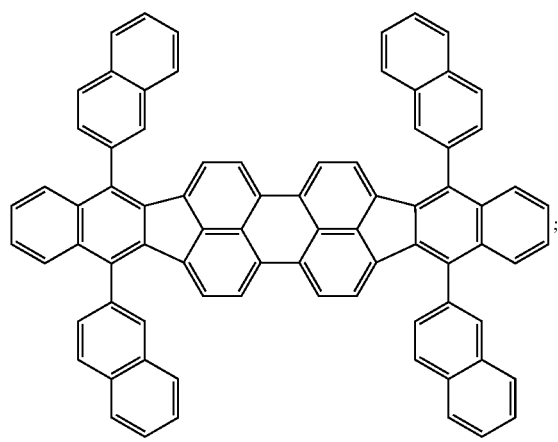;
Q15
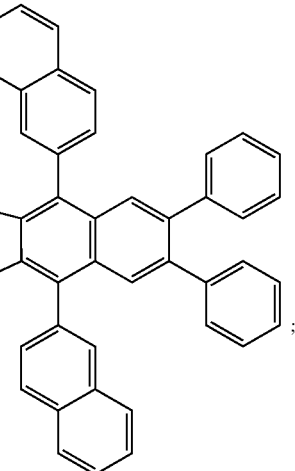;
Q16
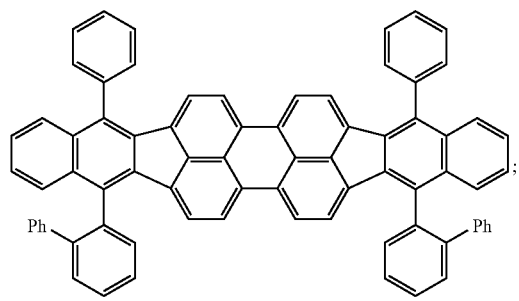;
Q17
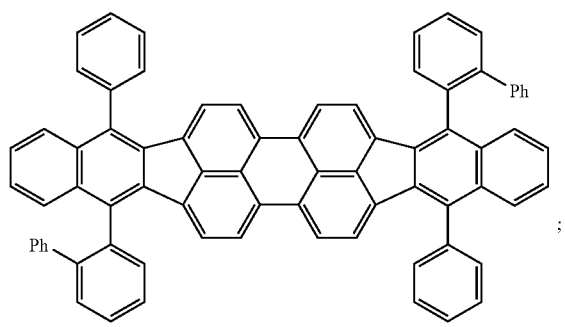;
Q18
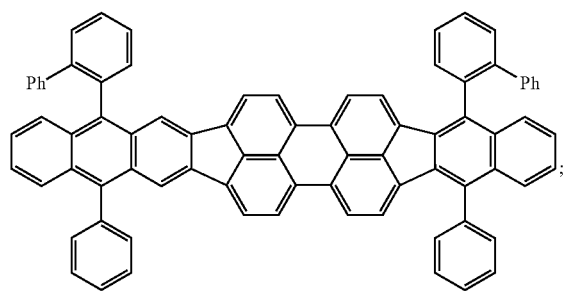;
Q19
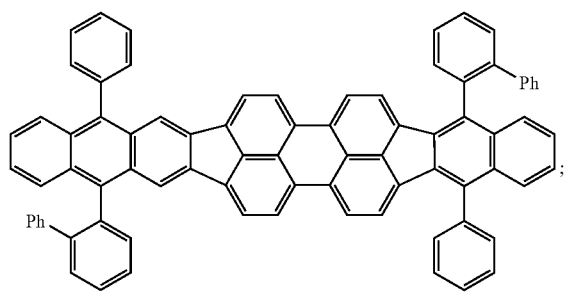;

-continued
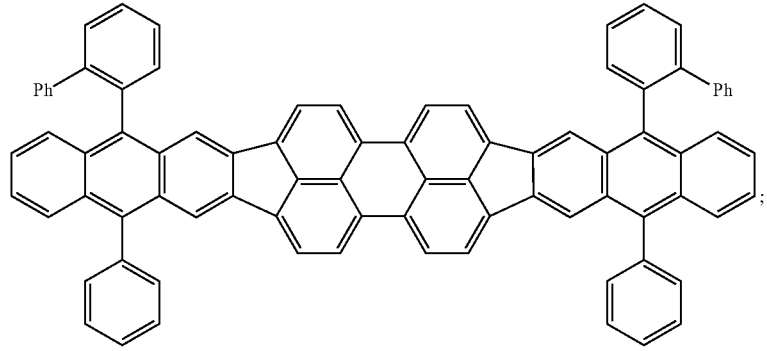
Q20
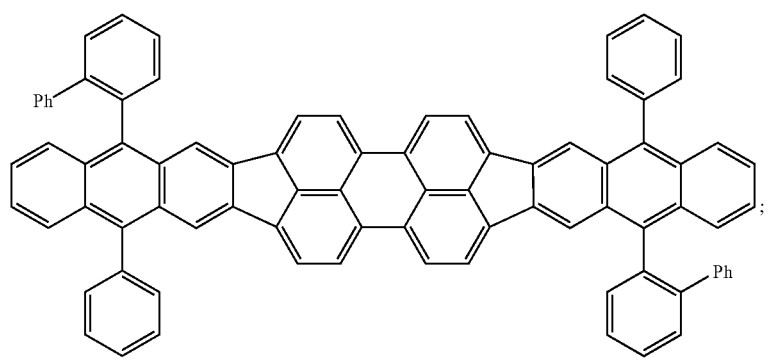
Q21
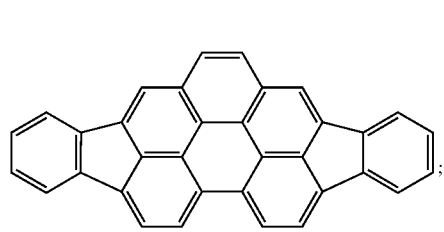
Q22
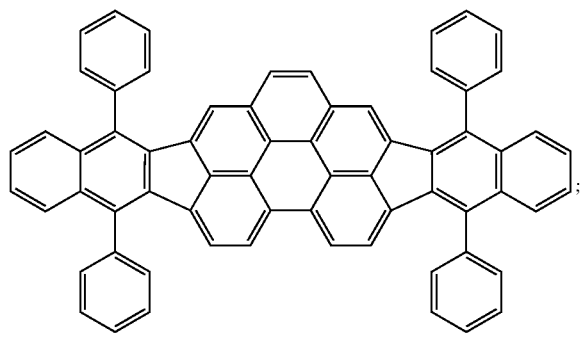
Q23
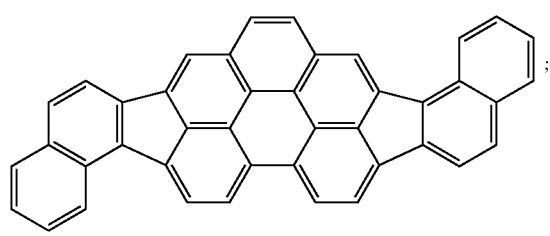
Q24
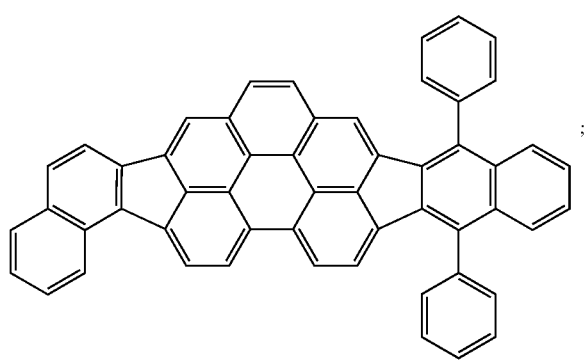
Q25

-continued

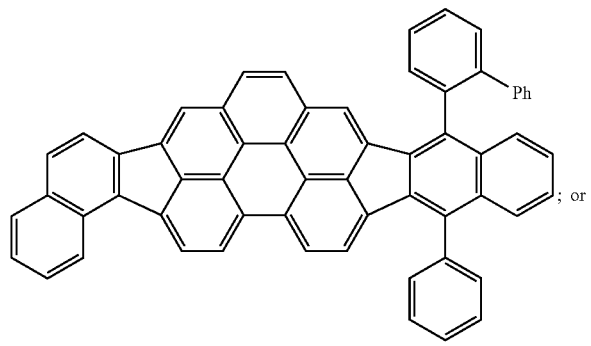
Q26

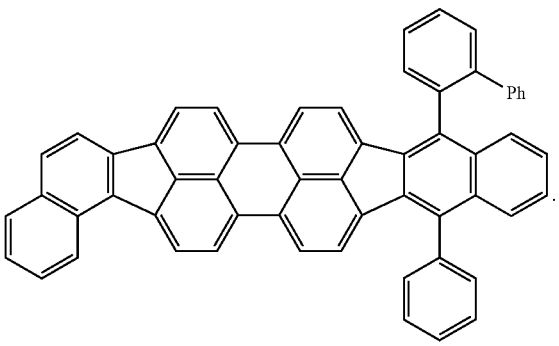
Q27

A particularly preferred diindenoperylene dopant is dibenzo{[f,f']-4,4'7,7'-tetraphenyl]diindeno-[1,2,3-cd:1',2',3'-lm]perylene (TPDBP, Q10 above).

Other red dopants useful in the present invention belong to the DCM class of dyes represented by Formula S1

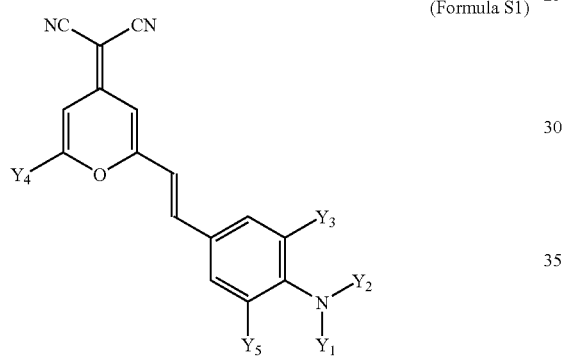
(Formula S1)

wherein:
$Y_1$-$Y_5$ represent one or more groups independently selected from hydro, alkyl, substituted alkyl, aryl, or substituted aryl; and
$Y_1$-$Y_5$ independently include acyclic groups or are joined pairwise to form one or more fused rings, provided that $Y_3$ and $Y_5$ do not together form a fused ring.

In a useful and convenient embodiment that provides red luminescence, $Y_1$-$Y_5$ are selected independently from: hydro, alkyl and aryl. Structures of particularly useful dopants of the DCM class are shown below:

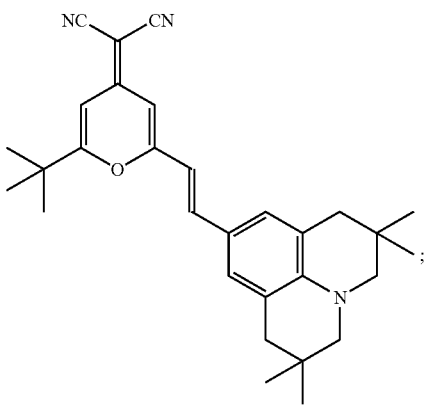
S2, DCJTB

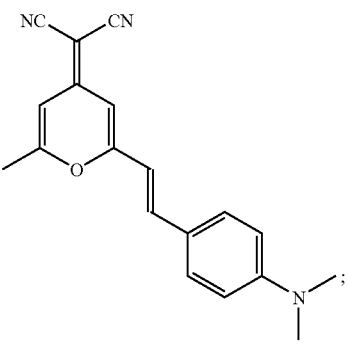
S3

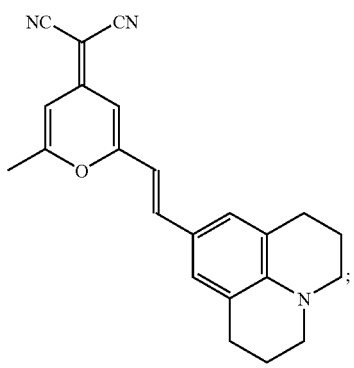
S4

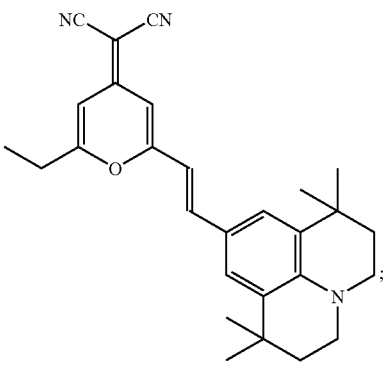
S5

-continued

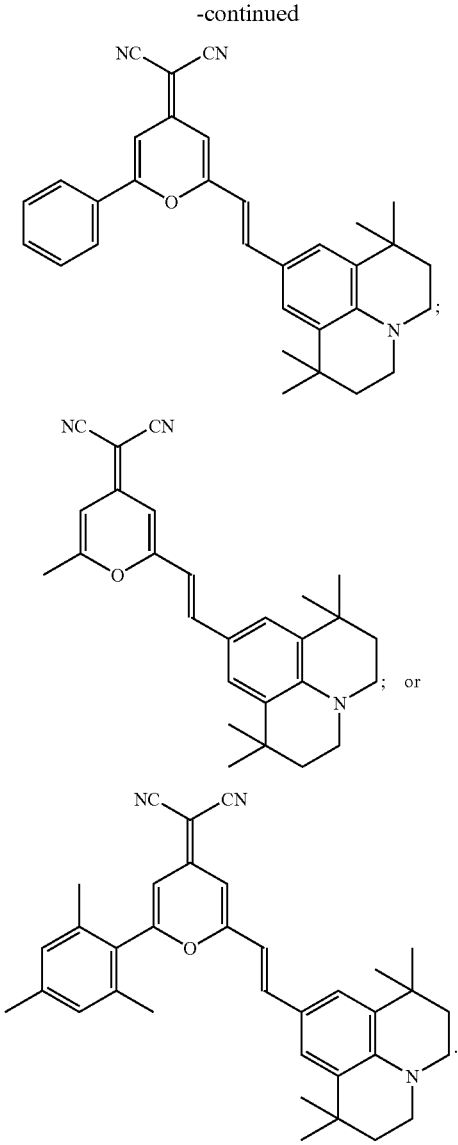

L37

L38

; or

L40

A preferred DCM dopant is DCJTB. The red dopant can also be a mixture of compounds that would also be red dopants individually. Further, the yellow, orange, or red light-emitting layer 50 can include a mixture of red-emitting and yellow-emitting dopants.

While not always necessary, it is often useful that OLED device 10 includes an electron-transporting layer 55 disposed over light-emitting layer 50. Desired electron-transporting materials can be deposited by any suitable way such as evaporation, sputtering, chemical vapor deposition, electrochemical means, thermal transfer, or laser thermal transfer from a donor material. Preferred electron-transporting materials for use in electron-transporting layer 55 are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula E, previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula G are also useful electron-transporting materials.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1-4, H. S. Nalwa, ed., John Wiley and Sons, Chichester (1997).

It will be understood that, as is common in the art, some of the layers can have more than one function. For example, light-emitting layers 45 and 50 can have hole-transporting properties or electron-transporting properties as desired for performance of the OLED device. Hole-transporting layer 40 or electron-transporting layer 55, or both, can also have emitting properties. In such a case, fewer layers than described above can be sufficient for the desired emissive properties.

The organic EL media materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be premixed and coated from a single boat or donor sheet.

An electron-injecting layer 60 can also be present between the cathode and the electron-transporting layer. Examples of electron-injecting materials include alkaline or alkaline earth metals, alkali halide salts, such as LiF mentioned above, or alkaline or alkaline earth metal doped organic layers.

The color filter 25 includes color filter elements for the color to be emitted from the pixel or subpixel of OLED device 10 and is part of a color filter array that is disposed over organic EL element 70. Color filter 25 is constructed to have a bandpass spectrum to pass a preselected color of light in response to white light, so as to produce a preselected color output. A combination particularly useful in a full color OLED device is a color filter array including at least three separate color filters 25 that have bandpass spectra from 605 nm to 700 nm, from 495 nm to 555 nm, and from 435 nm to 480 nm, for passing red, green, and blue light, respectively. Several types of color filters are known in the art. One type of color filter 25 is formed on a second transparent substrate and then aligned with the pixels of the first substrate 20. An alternative type of color filter 25 is formed directly over the elements of OLED device 10. In a display comprising multiple pixels, the space between the individual color filter elements can also be filled with a black matrix (not shown) to reduce pixel cross talk and improve the display's contrast. While color filter 25 is shown here as being located between anode 30 and substrate 20, it can alternatively be located on the outside surface of substrate 20. For a top-emitting device, color filter 25 can be located over cathode 90.

Figure 2:
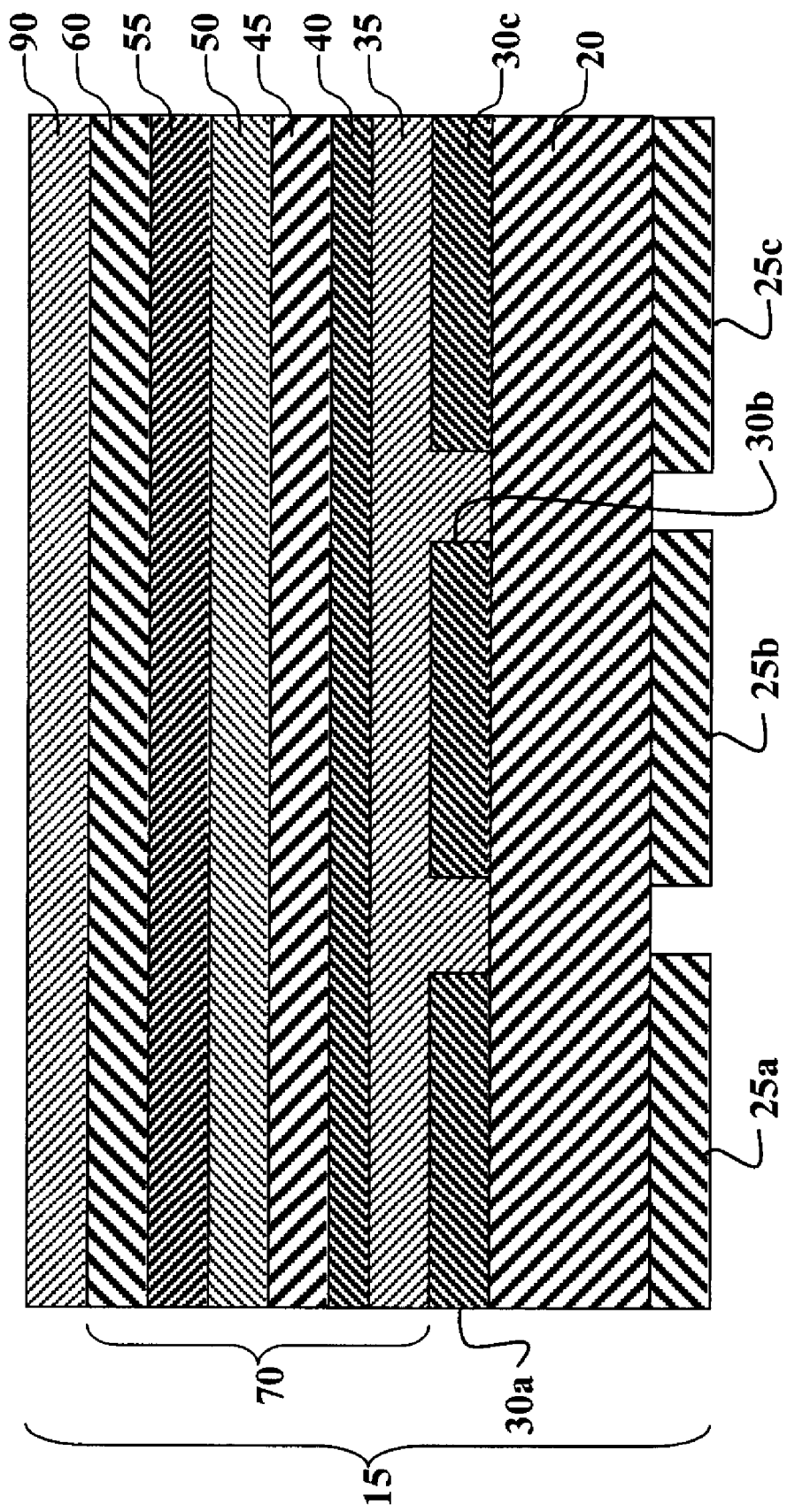
FIG. 2 is a cross-sectional view of an OLED device according to another embodiment of this invention.

Turning now to FIG. 2, there is shown a cross-sectional view of an OLED device 15 according to another embodiment of this invention. This embodiment is similar to the previous embodiment, except that the color filter is disposed over substrate 20, and the subpixels of a full-color pixel with multicolor filters are shown. The color filter array includes at least three separate filters, e.g. red color filter 25a, green color filter 25b, and blue color filter 25c, each of which forms part of a red, green, and blue subpixel, respectively. Each subpixel has its own anode 30a, 30b, and 30c, respectively, which are capable of independently causing emission of the individual subpixel.

There are numerous configurations of the organic EL media layers wherein the present invention can be successfully practiced. Examples of organic EL media layers that produce white light are described, for example, in EP 1 187 235, U.S. Patent Application Publication 2002/0025419 A1, EP 1 182 244, and U.S. Pat. Nos. 5,683,823, 5,503,910, 5,405,709, and 5,283,182. As shown in EP 1 187 235 A2, a white light-emitting organic EL element with a substantially continuous spectrum in the visible region of the spectrum can be achieved by providing at least two different dopants for collectively emitting white light, e.g. by the inclusion of the following layers:

a hole-injecting layer 35 disposed over the anode;

a hole-transporting layer 40 that is disposed over the hole-injecting layer 35 and is doped with a light-emitting yellow dopant for emitting light in the yellow region of the spectrum;

a blue light-emitting layer 50 including a host material and a light-emitting blue dopant disposed over the hole-transporting layer 40; and an electron-transporting layer 55.

Because such an emitter produces a wide range of wavelengths, it can also be known as a broadband emitter and the resulting emitted light known as broadband light.

The invention and its advantages can be better appreciated by the following comparative examples.

EXAMPLE 1 (COMPARATIVE)

A comparative OLED device was constructed in the following manner:

1. A clean glass substrate was vacuum-deposited with indium tin oxide (ITO) to form a transparent electrode of 85 nm thickness;
2. The above-prepared ITO surface was treated with a plasma oxygen etch, followed by plasma deposition of a 0.1 nm layer of a fluorocarbon polymer (CFx) as described in U.S. Pat. No. 6,208,075;
3. The above-prepared substrate was further treated by vacuum-depositing a 240 nm layer of 4,4'-bis[N-(1-naphthyl)-N-phenylamino]biphenyl (NPB) as a hole-transporting layer (HTL);
4. A 40 nm layer of 32 nm NPB and 8 nm rubrene containing 0.5% periflanthene was vacuum-deposited onto the substrate at a coating station that included a heated tantalum boat source to form a yellow light-emitting layer (yellow EML);
5. A coating of 50 nm of 2-tert-butyl-9,10-bis(2-naphthyl) anthracene (TBADN) with 9% NPB and 2.5% 4-(di-p-tolylamino)-4'-[(di-p-tolylamino)styryl]stilbene was evaporatively deposited on the above substrate to form a blue light-emitting layer (blue EML);
6. A 10 nm electron-transporting layer (ETL) of tris(8-quinolinolato)aluminum (III) (ALQ) was vacuum-deposited onto the substrate at a coating station that included a heated tantalum boat source; and
7. A 0.5 nm layer of lithium fluoride was evaporatively deposited onto the substrate, followed by a 100 nm layer of aluminum, to form a cathode layer.

EXAMPLE 2 (INVENTIVE)

An OLED device was constructed in the manner described in Example 1, except that step 5 was as follows:

5. A coating of 65 nm of 9-(2-naphthyl)-10-(4-biphenyl) anthracene (NBA) with 4% NPB and 2% 4-(di-p-tolylamino)-4'-[(di-p-tolylamino)styryl]stilbene was evaporatively deposited on the above substrate to form a blue light-emitting layer.

EXAMPLE 3 (INVENTIVE)

An OLED device was constructed in the manner described in Example 2, except that in step 5 the quantity of NPB was 7%.

EXAMPLE 4 (INVENTIVE)

An OLED device was constructed in the manner described in Example 2, except that in step 5 the quantity of NPB was 10%.

EXAMPLE 5 (INVENTIVE)

An OLED device was constructed in the manner described in Example 2, except that in step 5 the thickness of NBA was 52 nm.

EXAMPLE 6 (INVENTIVE)

An OLED device was constructed in the manner described in Example 5, except that in step 5 the quantity of NPB was 7%.

EXAMPLE 7 (INVENTIVE)

An OLED device was constructed in the manner described in Example 5, except that in step 5 the quantity of NPB was 10%.

Results (Examples 1-7)

The devices were tested by applying a current across the electrodes of 20 ma/cm$^2$ and measuring the spectrum. The intensity was then monitored as a function of time at a constant current of 80 ma/cm$^2$ and at a constant current of 20 ma/cm$^2$. The following table shows the results.

TABLE 1

| Example | Type | % NPB, nm NBA in Blue EML | Drive Voltage | Luminance (cd/A) @20 mA/cm² | CIEx | CIEy | Hours to 50% luminance @80 mA/cm² | Predicted Hours to 50% luminance @20 mA/cm² |
|---|---|---|---|---|---|---|---|---|
| 1 | Comparative | 9%, — | 9.88 | 11.39 | 0.35 | 0.33 | 220 | 2500 |
| 2 | Inventive | 4%, 65 nm | 11.51 | 10.15 | 0.44 | 0.35 | 1200 | >10,000 |
| 3 | Inventive | 7%, 65 nm | 10.93 | 11.05 | 0.38 | 0.36 | 1100 | >10,000 |
| 4 | Inventive | 10%, 65 nm | 10.06 | 10.39 | 0.35 | 0.36 | 1100 | >10,000 |
| 5 | Inventive | 4%, 52 nm | 10.59 | 10.57 | 0.45 | 0.35 | 1300 | >10,000 |
| 6 | Inventive | 7%, 52 nm | 10.00 | 11.06 | 0.40 | 0.35 | 1100 | >10,000 |
| 7 | Inventive | 10%, 52 nm | 9.68 | 11.31 | 0.37 | 0.34 | 900 | >10,000 |

EXAMPLE 8 (COMPARATIVE)

An OLED device was constructed in the manner described in Example 1, except that steps 3-5 were as follows:

3. The above-prepared substrate was further treated by vacuum-depositing a 200 nm layer of 4,4'-bis[N-(1-naphthyl)-N-phenylamino]biphenyl (NPB) as a hole-transporting layer (HTL);
4. A 30 nm layer of 24 nm NPB and 6 nm tBuDPN (Compound P6, above) containing 3% DBzR (Compound P4, above) was vacuum-deposited onto the substrate at a coating station that included a heated tantalum boat source to form a yellow light-emitting layer (yellow EML); and
5. A coating of 50 nm of 2-tert-butyl-9,10-bis(2-naphthyl)anthracene (TBADN) with 5 nm NPB and 0.75% BEP (Compound M7, above) was evaporatively deposited on the above substrate to form a blue light-emitting layer (blue EML).

EXAMPLE 9 (COMPARATIVE)

An OLED device was constructed in the manner described in Example 8, except that step 5 was as follows:

5. A coating of 50 nm of 9-(2-naphthyl)-10-(4-biphenyl)anthracene (NBA) with 5 nm NPB and 0.75% BEP was evaporatively deposited on the above substrate to form a blue light-emitting layer (blue EML).

Results (Examples 8-9)

The devices were tested by applying a current across the electrodes of 20 ma/cm² and measuring the spectrum. The intensity was then monitored as a function of time at a constant current of 80 ma/cm² to determine the time to 50% luminance. The following table shows the results.

This data shows that the use of 9-(2-naphthyl)-10-(4-biphenyl)anthracene as a host material in the blue-emitting layer of a white light-emitting OLED device gives extended emission life, by a factor of 3 to 6, in comparison to OLED devices wherein the blue host material is TBADN. A device with extended lifetime can be prepared with similar luminance, drive voltage, and CIE coordinates to the comparative examples, which use TBADN. Thus, a white light-emitting OLED device can be prepared as described herein with improved stability without sacrificing efficiency or desired hue.

The invention has been described in detail with particular reference to certain preferred embodiments thereof, but it will be understood that variations and modifications can be effected within the spirit and scope of the invention.

PARTS LIST

10 OLED device
15 OLED device
20 substrate
25 color filter
25a red color filter
25b green color filter
25c blue color filter
30 anode
30a anode
30b anode
30c anode
35 hole-injecting layer
40 hole-transporting layer
45 light-emitting layer
50 light-emitting layer
55 electron-transporting layer
60 electron-injecting layer
70 organic EL element
90 cathode

TABLE 2

| Example | Type | % NPB, nm NBA in Blue EML | Drive Voltage | Luminance (cd/A) @20 mA/cm² | CIEx | CIEy | Time to 50% luminance (hours) @80 mA/cm² |
|---|---|---|---|---|---|---|---|
| 8 | Comparative | 10%, — | 10.5 | 11.9 | 0.35 | 0.33 | 200 |
| 9 | Inventive | 10%, 50 nm | 9.39 | 12.29 | 0.39 | 0.33 | 600 |

What is claimed is:

1. A white light-emitting OLED device including spaced anode and cathode, and having blue light-emitting and yellow, orange, or red light-emitting layers, the blue light-emitting layer including
   a) a monoanthracene derivative of Formula (I) as a host material and a cohost material 4,4'-bis[N-(1-naphthyl)-N-phenylamino]biphenyl (NPB) that is in a range of 4-10% by volume of both host materials

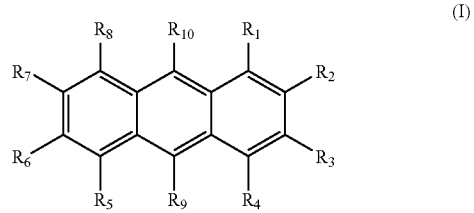

wherein:
   $R_1$-$R_8$ are H;
   $R_9$ is not the same as $R_{10}$;
   $R_9$ is a naphthyl group having no fused rings with aliphatic carbon ring members; and
   $R_{10}$ is a biphenyl group having no fused rings with aliphatic carbon ring members; and
   provided that $R_9$ and $R_{10}$ are free of amines and sulfur compounds; and
   b) a blue light-emitting dopant, wherein the blue-emitting dopant is from 0.25 to 5% by volume of the host materials.

2. The white light-emitting OLED device of claim 1 wherein the blue light-emitting dopant includes a tertiary aromatic amine.

3. The device of claim 1 wherein $R_9$ is a naphthyl group of two fused rings.

4. The device of claim 3 wherein $R_9$ is an unsubstituted naphthyl group.

5. The device of claim 1 wherein the naphthyl group contains a further fused ring.

6. The device of claim 1 wherein the naphthyl group contains two or more further fused rings.

7. The device of claim 1 wherein the naphthyl group is substituted with at least one substituent selected from fluorine, hydroxy, cyano, alkyl, alkoxy, aryloxy, aryl, carboxy, trimethylsilyl, and heterocyclic oxy groups.

8. The device of claim 1 wherein $R_9$ is a 2-naphthyl group.

9. The device of claim 1 wherein $R_{10}$ is an unsubstituted biphenyl group.

10. The device of claim 1 wherein at least one of the phenyl rings has a ring fused thereto.

11. The device of claim 1 wherein the biphenyl is substituted with another phenyl ring without fused rings to form a terphenyl ring system.

12. The device of claim 9 wherein the biphenyl is a 2-biphenyl.

13. The device of claim 9 wherein the biphenyl is a 3-biphenyl.

14. The device of claim 9 wherein the biphenyl is a 4-biphenyl.

15. The device of claim 11 wherein the rings are unsubstituted.

16. The device of claim 1 wherein the biphenyl is substituted with at least one stbstituent selected from fluorine, hydroxy, cyano, and alkyl, alkoxy, aryloxy, aryl, carboxy, trimethylsilyl, and heterocyclic oxy groups.

17. The device of claim 1 wherein Formula (I) is

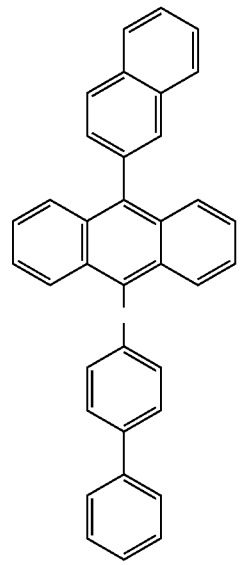

18. The device of claim 1 wherein the blue light-emitting dopant includes
   i) a compound of the structure

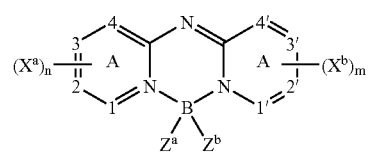

wherein:
   A and A' represent independent azine ring systems corresponding to 6-membered aromatic ring systems containing at least one nitrogen;
   $(X^a)_n$ and $(X^b)_m$ represent one or more independently selected substituents and include acyclic substituents or are joined to form a ring fused to A or A';
   m and n are independently 0 to 4;
   $Z^a$ and $Z^b$ are independently selected substituents;
   1, 2, 3, 4, 1', 2', 3', and 4' are independently selected as either carbon or nitrogen atoms; and
   provided that $X^a$, $X^b$, $Z^a$, and $Z^b$, 1, 2, 3, 4, 1', 2', 3', and 4' are selected to provide blue luminescence;
   ii) a blue-emitting derivative of a distyrylbenzene or a distyrylbiphenyl; or
   iii) perylene or a derivative of perylene.

19. The device of claim 18 wherein i) includes

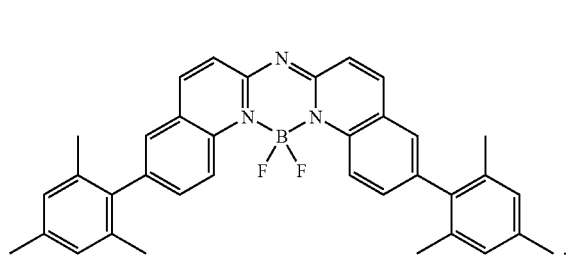

20. The device of claim 18 wherein ii) includes

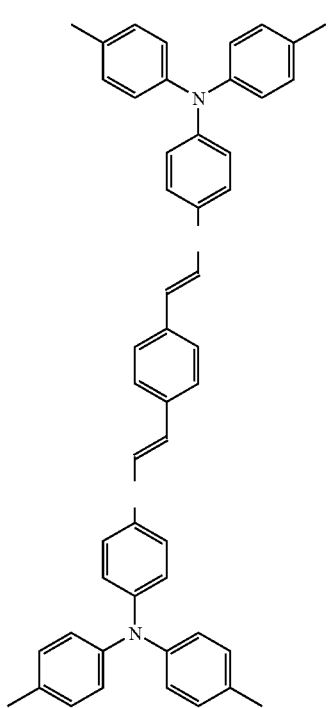

21. The device of claim 18 wherein iii) includes

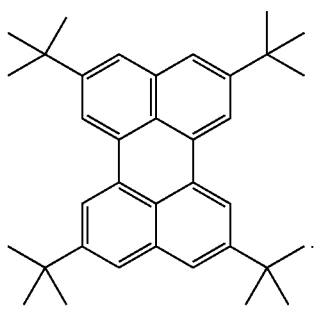

22. The device of claim 1 wherein the yellow, orange, or red light-emitting layer includes:

i) a compound of the following structure:

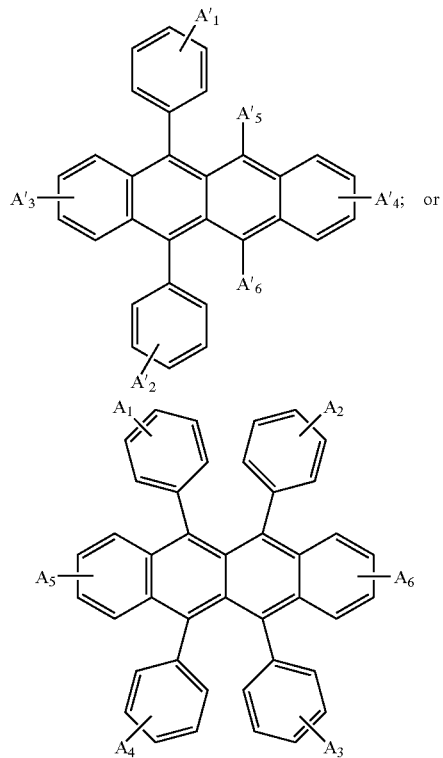

wherein $A_1$-$A_6$ represent one or more substituents on each ring and where each substituent is individually selected from one of the following:

Category 1: hydrogen, or alkyl of from 1 to 24 carbon atoms;

Category 2: aryl or substituted aryl of from 5 to 20 carbon atoms;

Category 3: hydrocarbon containing 4 to 24 carbon atoms, completing a fused aromatic ring or ring system;

Category 4: heteroaryl or substituted heteroaryl of from 5 to 24 carbon atoms such as thiazolyl, furyl, thienyl, pyridyl, quinolinyl or other heterocyclic systems, which are bonded via a single bond, or complete a fused heteroaromatic ring system;

Category 5: alkoxylamino, alkylamino, or arylamino of from 1 to 24 carbon atoms; or Category 6: fluoro, chloro, bromo or cyano;

ii) a diindenoperylene compound of the following structure:

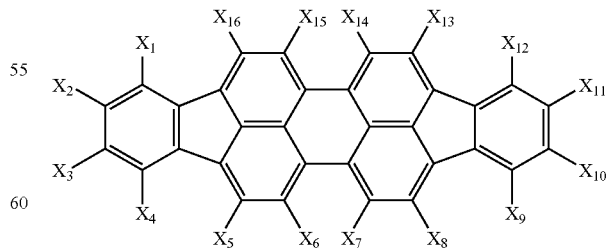

wherein:

$X_1$-$X_{16}$ are independently selected as hydro or substituents that provide red, yellow, or orange luminescence; or iii) a compound of the following structure:

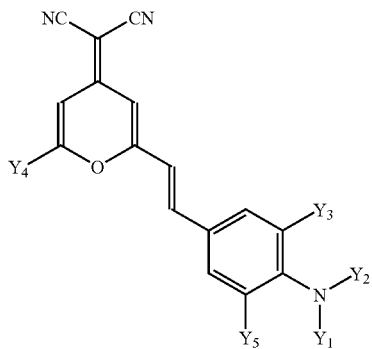

wherein:
- $Y_1$-$Y_5$ represent one or more groups independently selected from: hydro, alkyl, substituted alkyl, aryl, or substituted aryl;
- $Y_1$-$Y_5$ independently include acyclic groups or are joined pairwise to form one or more fused rings; provided that Y3 and Y5 do not together form a fused ring; or any combination of i), ii), and iii).

23. The device of claim 22 wherein i) includes

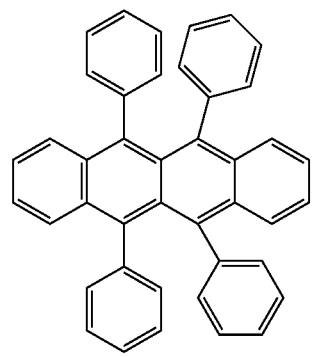

24. The device of claim 22 wherein ii) includes

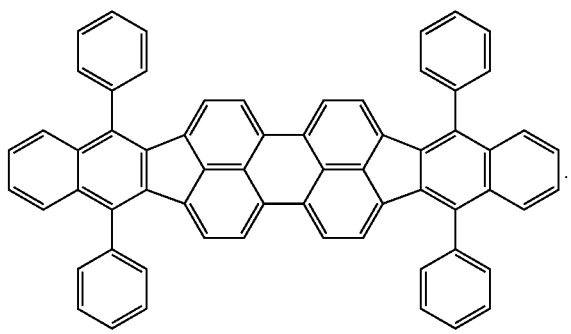

25. The device of claim 22 wherein iii) includes

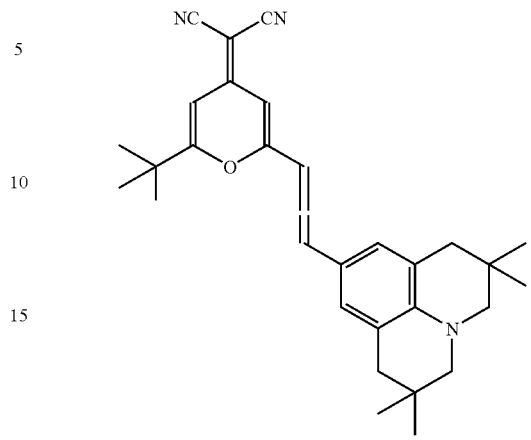

26. The device of claim 1 including a color filter array including at least three separate filters having bandpass spectra for passing red, green, and blue light, respectively, in response to white light to produce preselected color outputs.

27. The device of claim 26 wherein the bandpass spectrum of the red color filter is from 605 nm to 700 nm.

28. The device of claim 26 wherein the bandpass spectrum of the green color filter is from 495 nm to 555 nm.

29. The OLED device of claim 26 wherein the bandpass spectrum of the blue color filter is from 435 nm to 480 nm.

30. A white light-emitting OLED device including spaced anode and cathode, and having blue light-emitting and yellow, orange, or red light-emitting layers, the blue light-emitting layer including
  a) a monoanthracene derivative of Formula (I) as a host material and an arylamine cohost that is in a range of 4-10% by volume of both host materials

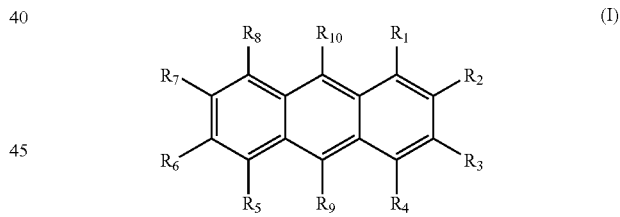

(I)

wherein:
- $R_1$-$R_8$ are H;
- $R_9$ is not the same as $R_{10}$;
- $R_9$ is a naphthyl group having no fused rings with aliphatic carbon ring members; and
- $R_{10}$ is a biphenyl group having no fused rings with aliphatic carbon ring members; and
- provided that $R_9$ and $R_{10}$ are free of amines and sulfur compounds; and
  b) a blue light-emitting dopant, wherein the blue-emitting dopant is from 0.25 to 50% by volume of the host materials.

* * * * *

UNITED STATES PATENT AND TRADEMARK OFFICE
CERTIFICATE OF CORRECTION

PATENT NO. : 7,252,893 B1
APPLICATION NO. : 10/780436
DATED : August 7, 2007
INVENTOR(S) : Michael L. Ricks et al.

It is certified that error appears in the above-identified patent and that said Letters Patent is hereby corrected as shown below:

| | |
|---|---|
| Column 50, Claim 16, line 4 | "stbstituent" should read --substituent-- |
| Column 50, Claim 18, lines 40-48 | delete structure and substitute with: |

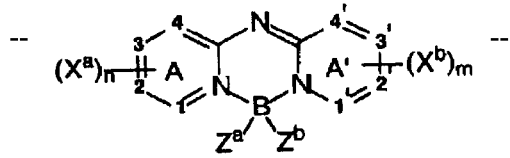

| | |
|---|---|
| Column 50, Claim 18, line 59 | "sub stituents;" should read --substituents;-- |
| Column 53, Claim 22, line 26 (approx.) | "Y3 and Y5" should read --$Y_3$ and $Y_5$-- |
| Column 54, Claim 30, line 38 | "of4-10%" should read --of 4-10%-- |
| Column 54, Claim 30, line 59 | "50%" should read --5%-- |

Signed and Sealed this

Seventeenth Day of June, 2008

JON W. DUDAS
*Director of the United States Patent and Trademark Office*